United States Patent
Han et al.

(10) Patent No.: US 7,098,505 B1
(45) Date of Patent: Aug. 29, 2006

(54) MEMORY DEVICE WITH MULTIPLE MEMORY LAYERS OF LOCAL CHARGE STORAGE

(75) Inventors: Kyung Joon Han, Palo Alto, CA (US); Sung-Rae Kim, San Jose, CA (US); Robert Broze, Santa Cruz, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/939,132

(22) Filed: Sep. 9, 2004

(51) Int. Cl.
*H01L 29/792* (2006.01)

(52) U.S. Cl. ............ 257/324; 365/185.28; 365/185.18; 365/185.29

(58) Field of Classification Search ........... 365/185.28, 365/185.18, 185.29, 185.33; 257/324
See application file for complete search history.

(56) References Cited

U.S. PATENT DOCUMENTS

| | | | |
|---|---|---|---|
| 6,190,949 B1 | 2/2001 | Noguchi et al. ............ 438/149 |
| 6,320,784 B1 | 11/2001 | Muralidhar et al. ........ 365/151 |
| 6,434,053 B1 | 8/2002 | Fujiwara ............... 365/185.28 |
| 6,548,830 B1 | 4/2003 | Noguchi et al. ............... 257/66 |
| 6,586,785 B1 | 7/2003 | Flagan et al. ............... 257/261 |
| 6,674,120 B1 | 1/2004 | Fujiwara ..................... 257/324 |
| 6,894,932 B1 * | 5/2005 | Melik-Martirosian et al. ..................... 365/185.28 |
| 2002/0000592 A1 | 1/2002 | Fujiwara ..................... 257/296 |
| 2002/0006723 A1 | 1/2002 | Goldstein ................... 438/660 |
| 2002/0074565 A1 | 6/2002 | Flagan et al. ............... 257/200 |
| 2002/0097621 A1 | 7/2002 | Fujiwara ..................... 365/204 |
| 2002/0098653 A1 | 7/2002 | Flagan et al. ............... 438/260 |
| 2002/0181914 A1 | 12/2002 | Jansen ......................... 385/130 |
| 2003/0013215 A1 | 1/2003 | Komoda et al. ............. 438/20 |
| 2003/0076023 A1 | 4/2003 | Komoda et al. ............ 313/310 |
| 2003/0090211 A1 | 5/2003 | Komoda et al. ......... 315/169.1 |
| 2003/0102793 A1 | 6/2003 | Komoda et al. ............ 313/311 |
| 2003/0106801 A1 | 6/2003 | Lockwood et al. ......... 205/220 |
| 2003/0131786 A1 | 7/2003 | Kauzlarich et al. ........... 117/88 |
| 2003/0143375 A1 | 7/2003 | Noguchi et al. ............. 428/143 |
| 2003/0161192 A1 | 8/2003 | Kobayashi et al. ......... 365/200 |
| 2003/0211502 A1 | 11/2003 | Sauer et al. ................... 435/6 |
| 2003/0230629 A1 | 12/2003 | Bourianoff et al. ......... 235/454 |

* cited by examiner

Primary Examiner—Mai-Huong Tran
(74) Attorney, Agent, or Firm—Sierra Patent Group, Ltd.

(57) ABSTRACT

A multiple memory layer device has a plurality of stacked memory layers. Each of the memory layers has: a charge generating layer of p-type semiconductor material with a plurality of n-type diffusion regions; an insulating layer disposed over the charge generating layer; a charge storing layer disposed over the insulating layer; and another insulating layer disposed over the charge storing layer. A gate is disposed over the top insulating layer in the uppermost memory layer in the plurality of stacked memory layers.

20 Claims, 12 Drawing Sheets

|  | Substrate (12) | Gate (24) | S/D (14) | S/D (16) |
|---|---|---|---|---|
| Substrate Ground Mode | 0V | 9V to 12V | 0V | 4V to 5V |
| Substrate Enhanced Mode | -2V to -3V | 6V to 8V | 0V | 3V to 4V |

|  | Substrate (12) | Gate (24) | S/D (14) | S/D (16) |
|---|---|---|---|---|
| Substrate Ground Mode | 0V | 12V to 15V | 0V or Float | 0V or Float |
| Substrate Enhanced Mode | -6V to -8V | 6V to 8V | -6V to -8V or Float | -6V to -8V or Float |

|  | Substrate (12) | Gate (24) | S/D (14) | S/D (16) |
|---|---|---|---|---|
| Substrate Ground Mode (One-Sided) | 0V | -10V to -12V | 5V to 6V | Float |
| Substrate Enhanced Mode (One-Sided) | -2V to -3V | -6V to -8V | 3V to 4V | Float |
| Substrate Ground Mode (Two-Sided) | 0V | -10V to -12V | 5V to 6V | 5V to 6V |
| Substrate Enhanced Mode (Two-Sided) | -2V to -3V | -6V to -8V | 5V to 6V | 5V to 6V |

FIG. 2C  Prior Art

|  | Substrate (12) | Gate (24) | S/D (14) | S/D (16) |
|---|---|---|---|---|
| Substrate Ground Mode | 0V | -12V to -15v | 0V or Float | 0V or Float |
| Substrate Enhanced Mode | 6V | -6V to -8V | 0V or Float | 0V or Float |

FIG. 2D  Prior Art

|  | Substrate (12) | Gate (24) | S/D (14) | S/D (16) |
|---|---|---|---|---|
| Substrate Ground Mode | 0V | 3V to 4V | 1V to 2V | 0V |

FIG. 2E  Prior Art

|  | Sub (32) | Gate (44) | S/D (34) | S/D (36) |
|---|---|---|---|---|
| Substrate Ground Mode | 0V | 8V to 9V | 0V | 4V to 5V |
| Substrate Enhanced Mode | -2V to -3V | 6V to 8V | 0V | 3V to 4V |

|  | Sub (32) | Gate (44) | S/D (34) | S/D (36) |
|---|---|---|---|---|
| Substrate Ground Mode | 0V | 12V to 14V | 6V to 7V | 6V to 7V or Float |
| Substrate Enhanced Mode | -6V to -8V | 6V to 8V | -6V to -8V |  |

|  | Substrate (32) | Gate (44) | S/D (34) | S/D (36) |
|---|---|---|---|---|
| Substrate Ground Mode (One-Sided) | 0V | -10V to -12V | 5V to 6V | Float |
| Substrate Enhanced Mode (One-Sided) | -2V to -3V | -6V to -8V | 3V to 4V | Float |
| Substrate Ground Mode (Two-Sided) | 0V | -10V to -12V | 5V to 6V | 5V to 6V |
| Substrate Enhanced Mode (Two-Sided) | -2V to -3V | -6V to -8V | 5V to 6V | 5V to 6V |

FIG. 4C   Prior Art

|  | Substrate (32) | Gate (44) | S/D (34) | S/D (36) |
|---|---|---|---|---|
| Substrate Ground Mode | 0V | -12V to -15V | 0V or Float | 0V or Float |

FIG. 4D   Prior Art

|  | Substrate (32) | Gate (44) | S/D (34) | S/D (36) |
|---|---|---|---|---|
| Substrate Ground Mode | 0V | 3V to 4V | 1V to 2V | 0V |

FIG. 4E   Prior Art

MEMORY DEVICE WITH MULTIPLE MEMORY LAYERS OF LOCAL CHARGE STORAGE

BACKGROUND OF THE INVENTION

1. Field of the Invention

The present invention relates to a local charge storing memory device. More particularly, the present invention relates to a memory device with multiple memory layers of local charge storage.

2. The Background Art

There are a variety of non-volatile memory devices known to those of ordinary skill in the art. These include antifuses, floating gate transistors, and floating trap transistors. An antifuse is a programmable device that includes a first and second electrode having a dielectric disposed between the first and second electrodes. It is an open state until programmed. It is programmed by placing a voltage across the first and second electrodes sufficient to cause current to flow between the electrodes to form a conductive link between the electrodes. Once programmed, the antifuse provides a conductive path between conductive lines coupled to the first and second electrodes of the antifuse.

A floating gate transistor is an MOS based device having an unconnected or floating polysilicon layer disposed in a dielectric between the semiconductor surface and the gate of the MOS transistor. There are a variety of known floating gate transistor technologies. These differences in the art are due at least in some instances to the specific geometry of the floating gate, the distance from the semiconductor surface of the floating gate in the dielectric, the inclusion of additional gates in the MOS transistor of the floating gate memory cell, the manner in which electrons are placed on and removed from the floating gate, and the diverse arrangements of the floating gate transistors into memory cell arrays. These various technologies, well known to those of ordinary skill in the art, include electrically programmable read only memory (EPROM), electrically erasable and programmable read only memory (EEPROM), flash EEPROM, NOR flash and NAND flash.

To program the floating gate transistor, electrons are placed on the floating polysilicon layer, and to erase the floating gate memory cell, electrons are removed from the floating polysilicon layer. According to the particular floating gate transistor technology involved, electrons are (a) placed onto the floating gate; and (b) removed from the floating gate by a combination of (a) channel hot electron injection or Fowler-Nordheim tunneling; and (b) UV light, hot hole injection or Fowler-Nordheim tunneling, respectively. Each of these methods for placing and removing electrons on the floating gate requires the gate, source, drain and substrate of the floating gate transistor to either be biased to voltages relative to one another or to float for a time sufficient to either program or erase the floating gate transistor.

A floating gate memory cell is programmed when sufficient electrons are placed on the floating polysilicon layer to prevent the MOS transistor of the floating gate memory cell from being turned on. The charged floating polysilicon layer opposes a voltage which, when applied to the gate of the floating gate memory cell would typically turn-on the MOS transistor of the floating gate memory cell. When these electrons are removed, a normal operating voltage applied to the gate of floating gate transistor will result in current flowing through the MOS transistor of the floating gate memory cell. This current may then be sensed to determine whether a particular floating gate memory cell has been programmed.

Conventional floating gate memory cells have some performance characteristics such as long programming and erase times, high programming voltages, insufficient data retention times, limited number of programming cycles, and large integrated circuit area requirements which have led to the investigation and development of local charge storage MOS transistors such as floating trap MOS transistors and floating gate silicon nanocrystal MOS transistors.

In FIG. 1, an n-channel floating trap MOS transistor 10 according to the prior art is illustrated schematically in cross section. In n-channel floating trap MOS transistor 10, a p-type region 12 formed by a p-type semiconductor substrate or p-type well formed in a semiconductor substrate has a first n-type source/drain (S/D) region 14 and a second n-channel source/drain region 16. A lower silicon dioxide layer 18 of about 20 to about 60 angstroms in thickness is disposed above the p-type region 12 and a portion of the source and drain regions 14 and 16, respectively. A silicon nitride layer 20 of about 60 to about 80 angstroms in thickness is disposed above the silicon dioxide layer 18. The silicon nitride layer 20 forms a floating trap layer that traps electrons as they are injected across the oxide layer 18 and into the nitride layer 20. An upper layer of silicon dioxide 22 of about 60 angstroms is formed over the nitride layer 20. A polysilicon or metal conductive control gate 24 is disposed above the upper oxide layer 22. The upper oxide layer 22 functions to electrically isolate the conductive gate 24 from floating trap 20.

Two well known, and similar floating trap transistor technologies include silicon-oxide-nitride-oxide-silicon (SONOS) and metal-oxide-nitride-oxide-silicon (MONOS). In each of these devices, the dielectric separating the gate of the MOS transistor from the semiconductor substrate is an oxide-nitride-oxide (ONO) layer. In a recent advance in the floating trap transistor technology of MONOS/SONOS devices, a thicker bottom oxide layer in the ONO dielectric has been employed to improve charge retention and to reduce read disturb.

In a floating trap MOS transistor, charge is stored (trapped) in or removed from after being trapped in, a dielectric separating the gate of the MOS transistor from the semiconductor substrate. Unlike a floating gate transistor, where charge stored on the polysilicon conductor may flow freely within the polysilicon conductor, charge stored in a floating trap MOS transistor is localized to the region of the floating trap material above the source or drain where it was originally placed during programming. Accordingly, a bit of information may be stored above each of the junctions of a floating trap MOS transistor for a total of two bits. To program a floating trap MOS transistor device both channel hot electron injection and Fowler-Nordheim tunneling have been employed. To erase a floating trap MOS transistor device both Fowler-Nordheim tunneling and tunneling enhanced hot hole injection have been employed.

In FIG. 2A, a table indicates the voltages applied to the floating trap MOS transistor 10 depicted in FIG. 1 for programming by channel hot electron injection in either a Substrate Ground Mode or a Substrate Enhanced Mode. As set forth therein, in the Substrate Ground Mode wherein the substrate 12 is at about 0 volts, the gate 24 is held at about 9 volts to about 12 volts, and the first source/drain 14 of n-channel floating trap MOS transistor above whose junction the electrons are to be trapped is held at about 0 volts, while the second source/drain 16 of the n-channel floating trap MOS transistor is held at about 4 volts to about 5 volts. In the Substrate Enhanced Mode wherein the substrate 12 is at about −2 volts to about −3 volts, the gate 24 is held at about 6 volts to about 8 volts, and the first source/drain 14 of n-channel floating trap MOS transistor above whose junction the electrons are to be trapped is held at about 0 volts, while the second source/drain 16 of the n-channel floating trap MOS transistor is held at about 3 volts to about 4 volts. The programming time for channel hot electron injection is about 1 ms to about 5 ms.

In FIG. 2B, a table indicates the voltages applied to the floating trap MOS transistor 10 depicted in FIG. 1 for programming by Fowler-Nordheim tunneling in either a Substrate Ground Mode or a Substrate Enhanced Mode. With Fowler-Nordheim tunneling, both of the areas above the junctions of the first and second source/drain regions 14 and 16, respectively, are programmed at the same time. As set forth therein, in the Substrate Ground Mode wherein the substrate 12 is at about 0 volts, the gate 24 is held at about 12 volts to about 15 volts, and the first source/drain 14 of n-channel floating trap MOS transistor is held at about 0 volts or allowed to float, while the second source/drain 16 of the n-channel floating trap MOS transistor is held at about 0 volts or allowed to float. In the Substrate Enhanced Mode wherein the substrate 12 is at about −6 volts to about −8 volts, the gate 24 is held at about 6 volts to about 8 volts, and the first source/drain 14 and the second source/drain 16 of n-channel floating trap MOS transistor are held at about −6V to −8 volts or allowed to float. The programming time for Fowler-Nordheim tunneling is about 2 ms to 20 ms.

In FIG. 2C, a table indicates the voltages applied to the floating trap MOS transistor 10 depicted in FIG. 1 for erasing either one or both areas above the source/drain junctions of source/drain regions 14 and 16, respectively, by hot hole injection in either a Substrate Ground Mode or a Substrate Enhanced Mode. As set forth therein, in the one-sided Substrate Ground Mode wherein the substrate 12 is at about 0 volts, the gate 24 is held at about −10 volts to about −12 volts, and the first source/drain 14 of n-channel floating trap MOS transistor above whose junction the electrons are to be erased is held at about 5 volts to about 6 volts, while the second source/drain 16 of the n-channel floating trap MOS transistor is allowed to float. In the one-sided Substrate Enhanced Mode wherein the substrate 12 is at about −2 volts to about −3 volts, the gate 24 is held at about −6 volts to about −8 volts, and the first source/drain 14 of n-channel floating trap MOS transistor above whose junction the electrons are to be erased is held at about 3 volts to about 4 volts, while the second source/drain 16 of the n-channel floating trap MOS transistor is allowed to float. In the two-sided Substrate Ground Mode wherein the substrate 12 is at about 0 volts, the gate 24 is held at about −10 volts to about −12 volts, and the first and second source/drain regions 14 and 16, respectively, of n-channel floating trap MOS transistor above whose junction the electrons are to be erased are held at about 5 volts to about 6 volts. In the two-sided Substrate Enhanced Mode wherein the substrate 12 is at about −2 volts to about −3 volts, the gate 24 is held at about −6 volts to about −8 volts, and the first and second source/drain regions 14 and 16, respectively, of n-channel floating trap MOS transistor above whose junction the electrons are to be erased are held at about 5 volts to about 6 volts. The erase time for hot hole injection is about 1 ms to 5 ms.

In FIG. 2D, a table indicates the voltages applied to the floating trap MOS transistor 10 depicted in FIG. 1 for erasure by Fowler-Nordheim tunneling in either a Substrate Ground Mode or a Substrate Enhanced Mode. With Fowler-Nordheim tunneling, both of the areas above the junctions of the first and second source/drain regions 14 and 16, respectively, are erased at the same time. As set forth therein, in the Substrate Ground Mode wherein the substrate 12 is at about 0 volts, the gate 24 is held at about −12 volts to about −15 volts, and the first source/drain 14 of n-channel floating trap MOS transistor is held at about 0 volts or allowed to float, while the second source/drain 16 of the n-channel floating trap MOS transistor is held at about 0 volts or allowed to float. In the Substrate Enhanced Mode wherein the substrate 12 is at about 6 volts, the gate 24 is held at about −6 volts to about −8 volts, and the first source/drain 14 of n-channel floating trap MOS transistor is held at about 0 volts or allowed to float, while the second source/drain 16 of the n-channel floating trap MOS transistor is held at about 0 volts or allowed to float. The erasure time for Fowler-Nordheim tunneling is about 2 ms to 20 ms.

In FIG. 2E, a table indicates the voltages applied to the floating trap MOS transistor depicted in FIG. 1 for reading the floating trap MOS transistor in a Substrate Ground Mode. As set forth therein, in a n-channel floating trap MOS transistor with the p-type substrate 12 at about 0 volts, to read the charge trapped above a first junction associated with a first source/drain region 14 of the n-channel floating trap MOS transistor 10, the gate 24 of the n-channel floating trap MOS transistor 10 is held at about 3 volts to about 4 volts, and the first source/drain 14 of n-channel floating trap MOS transistor above whose junction the electrons are to be read is held at about 1 volt to about 2 volts, while the second source/drain 16 of the n-channel floating trap MOS transistor is held at about 0 volts. During the read, a sense of the current through the n-channel floating trap MOS transistor is performed to determine the programmed state of the floating trap device. In U.S. Pat. No. 5,768,192, a charge trapping device is described that is programmed using channel hot electron injection, and erased with tunneling enhanced hot hole injection. As described therein, a reverse read scheme is employed to enhance charge read sensitivity, wherein a read of the charge trapped above a first junction associated with a first source/drain region of an n-channel floating trap MOS transistor is performed by applying about 0 volts to a p-type substrate while applying about 3 volts to about 4 volts to the gate of the n-channel floating trap MOS transistor, 0 volts to the first source/drain region of the n-channel floating trap MOS transistor above whose junction the electrons are to be read, and about 1 volt to about 2 volts to a second source/drain 16 of the n-channel floating trap MOS transistor.

In FIG. 3, an n-channel floating gate silicon nanocrystal MOS transistor 30 according to the prior art is illustrated schematically in cross section. In n-channel floating gate silicon nanocrystal MOS transistor 30, a p-type region 32 formed by a p-type semiconductor substrate or p-type well formed in a semiconductor substrate has a first n-type source/drain (S/D) region 34 and a second n-channel source/drain region 36. A lower silicon dioxide layer 38 of about 20 to about 60 angstroms in thickness is disposed above the p-type region 32 and a portion of the source and drain regions 34 and 36, respectively. A layer of silicon nanocrystals 40 typically having diameters of about 40 angstroms to about 100 angstroms and spaced apart by about 40 angstroms to about 60 angstroms is disposed above the silicon dioxide layer 38. The silicon nanocrystal layer 40 forms a floating gate that traps charge as it is injected across the oxide layer 38 and into the silicon nanocrsytal layer 40. An upper layer of silicon dioxide 42 of about 60 angstroms is formed over the silicon nanocrystal layer 40. A polysilicon or metal conductive control gate 44 is disposed above the upper oxide layer 42. The upper oxide layer 42 functions to electrically isolate the conductive gate 44 from floating gate 40.

In a floating gate silicon nanocrystal MOS transistor, charge is stored (trapped) in or removed from after being trapped in the silicon nanocrystals. Unlike a conventional floating gate transistor, where charge stored on the polysilicon conductor may flow freely in the polysilicon conductor, charge stored in a floating gate silicon nanocrystal MOS transistor is localized to the region of the floating nanocrystal material above the source or drain where it was originally placed during programming. Accordingly, a bit of information may be stored above each of the junctions of a nanocrystal based MOS transistor for a total of two bits. This two-bit charge storage is analogous to the two-bit charge storage provided by a floating trap MOS transistor such as SONOS or MONOS. To program a floating gate silicon nanocrystal MOS transistor device both channel hot electron injection and Fowler-Nordheim tunneling have been employed. To erase a floating trap MOS transistor device both Fowler-Nordheim tunneling and tunneling enhanced hot hole injection have been employed In FIG. 4A, a table indicates the voltages applied to the floating gate silicon nanocrystal MOS transistor 30 depicted in FIG. 3 for programming by channel hot electron injection in either a Substrate Ground Mode or a Substrate Enhanced Mode. As set forth therein, in the Substrate Ground Mode wherein the substrate 32 is at about 0 volts, the gate 44 is held at about 8 volts to about 9 volts, and the first source/drain 34 of n-channel floating gate silicon nanocrystal MOS transistor 30 above whose junction the electrons are to be trapped is held at about 0x volts, while the second source/drain 36 of the n-channel floating gate silicon nanocrystal MOS transistor is held at about 4 volts to about 5 volts. In the Substrate Enhanced Mode wherein the substrate 32 is at about −2 volts to about −3 volts, the gate 44 is held at about 6 volts to about 8 volts, and the first source/drain 34 of n-channel floating gate silicon nanocrystal MOS transistor above whose junction the electrons are to be trapped is held at about 0 volts, while the second source/drain 36 of the n-channel floating gate silicon nanocrystal MOS transistor is held at about 3 volts to about 4 volts. The programming time for channel hot electron injection is about 1 ms to about 5 ms.

In FIG. 4B, a table indicates the voltages applied to the floating gate silicon nanocrystal MOS transistor 30 depicted in FIG. 3 for programming by Fowler-Nordheim tunneling in either a Substrate Ground Mode or a Substrate Enhanced Mode. With Fowler-Nordheim tunneling, both of the areas above the junctions of the first and second source/drain regions 34 and 36, respectively, are programmed at the same time. As set forth therein, in the Substrate Ground Mode wherein the substrate 32 is at about 0 volts, the gate 44 is held at about 12 volts to about 14 volts, and the first source/drain 34 of n-channel floating trap MOS transistor is held at about 6 volts to about 7 volts, while the second source/drain 36 of the n-channel nanocrystal MOS transistor is held at about 6 volts to about 7 volts or allowed to float. In the Substrate Enhanced Mode wherein the substrate 32 is at about −6 volts to about −8 volts, the gate 44 is held at about 6 volts to about 8 volts, and the first source/drain 34 of n-channel nanocrystal MOS transistor is held at about −6 volts to about −8 volts, while the second source/drain 36 of the n-channel floating gate silicon nanocrystal MOS transistor is held at about −6 volts to about −8 volts. The programming time for Fowler-Nordheim tunneling is about 2 ms to 20 ms.

In FIG. 4C, a table indicates the voltages applied to the floating gate silicon nanocrystal MOS transistor 30 depicted in FIG. 3 for erasing either one or both areas above the source/drain junctions of source/drain regions 34 and 36, respectively, by hot hole injection in either a Substrate Ground Mode or a Substrate Enhanced Mode. As set forth therein, in the one-sided Substrate Ground Mode wherein the substrate 32 is at about 0 volts, the gate 44 is held at about −10 volts to about −12 volts, and the first source/drain 34 of n-channel floating trap MOS transistor above whose junction the electrons are to be erased is held at about 5 volts to about 6 volts, while the second source/drain 36 of the n-channel floating trap MOS transistor is allowed to float. In the one-sided Substrate Enhanced Mode wherein the substrate 32 is at about −2 volts to about −3 volts, the gate 44 is held at about −6 volts to about −8 volts, and the first source/drain 44 of n-channel floating gate silicon nanocrystal MOS transistor above whose junction the electrons are to be erased is held at about 3 volts to about 4 volts, while the second source/drain 36 of the n-channel floating gate silicon nanocrystal MOS transistor is allowed to float. In the two-sided Substrate Ground Mode wherein the substrate 32 is at about 0 volts, the gate 44 is held at about −10 volts to about −12 volts, and the first and second source/drain regions 34 and 36, respectively, of n-channel floating gate silicon nanocrystal MOS transistor above whose junction the electrons are to be erased are held at about 5 volts to about 6 volts. In the two-sided Substrate Enhanced Mode wherein the substrate 32 is at about −2 volts to about −3 volts, the gate 44 is held at about −6 volts to about −8 volts, and the first and second source/drain regions 34 and 36 respectively, of n-channel floating gate silicon nanocrystal MOS transistor above whose junction the electrons are to be erased are held at about 5 volts to about 6 volts. The erase time for hot hole injection is about 1 ms to 5 ms.

In FIG. 4D, a table indicates the voltages applied to the floating gate silicon nanocrystal MOS transistor 30 depicted in FIG. 3 for erasure by Fowler-Nordheim tunneling in either a Substrate Ground Mode or a Substrate Enhanced Mode. With Fowler-Nordheim tunneling, both of the areas above the junctions of the first and second source/drain regions 34 and 36, respectively, are erased at the same time. As set forth therein, in the Substrate Ground Mode wherein the substrate 32 is at about 0 volts, the gate 44 is held at about −12 volts to about −15 volts, and the first source/drain 34 of n-channel floating gate silicon nanocrystal MOS transistor is held at about 0 volts or allowed to float, while the second source/drain 36 of the n-channel floating gate silicon nanocrystal MOS transistor is held at about 0 volts or allowed to float. The erasure time for Fowler-Nordheim tunneling is about 2 ms to 20 ms.

In FIG. 4E, a table indicates the voltages applied to the floating gate silicon nanocrystal MOS transistor 30 depicted in FIG. 3 for reading the floating gate silicon nanocrystal MOS transistor in a Substrate Ground Mode. As set forth therein, in a n-channel floating gate silicon nanocrystal MOS transistor with the p-type substrate 32 at about 0 volts, to read the charge trapped above a first junction associated with a first source/drain region 34 of the n-channel floating gate silicon nanocrystal MOS transistor 30, the gate 44 of the n-channel floating gate silicon nanocrystal MOS transistor 30 is held at about 3 volts to about 4 volts, and the first source/drain 34 of n-channel floating gate silicon nanocrystal MOS transistor above whose junction the electrons are to be read is held at about 1 volt to about 2 volts, while the second source/drain 36 of the n-channel floating gate silicon nanocrystal MOS transistor is held at about 0 volts. During the read, a sense of the current through the n-channel floating gate silicon nanocrystal MOS transistor is performed to determine the programmed state of the floating gate silicon nanocrystal device.

BRIEF DESCRIPTION OF THE INVENTION

A multiple memory layer device has a plurality of stacked memory layers. Each of the memory layers has: a charge generating layer of p-type semiconductor material with a plurality of n-type diffusion regions; an insulating layer disposed over the charge generating layer; a charge storing layer disposed over the insulating layer; and another insulating layer disposed over the charge storing layer. A gate is disposed over the top insulting layer in the uppermost memory layer in the plurality of stacked memory layers.

A method of forming a multiple memory layer device includes forming two n-type diffusion regions in a p-type semiconductor material layer; forming an insulating layer over the semiconductor material layer; forming a charge storing layer over the insulating layer; forming a second insulating layer over the charge storing layer. These steps are repeated to form a stacked multiple memory layer.

BRIEF DESCRIPTION OF THE DRAWINGS

FIG. 2C is a table indicating the voltages applied to the floating trap MOS transistor depicted in FIG. 1 for erasing by hot hole injection according to the prior art.

FIG. 2D is a table indicating the voltages applied to the floating trap MOS transistor depicted in FIG. 1 for erasing by Fowler-Nordheim tunneling according to the prior art.

FIG. 2E is a table indicating the voltages applied to the floating trap MOS transistor depicted in FIG. 1 for reading the floating trap MOS transistor according to the prior art.

FIG. 4C is a table indicating the voltages applied to the floating gate silicon nanocrystal MOS transistor depicted in FIG. 3 for erasing by hot hole injection according to the prior art.

FIG. 4D is a table indicating the voltages applied to the floating gate silicon nanocrystal MOS transistor depicted in FIG. 3 for erasing by Fowler-Nordheim tunneling according to the prior art.

FIG. 4E is a table indicating the voltages applied to the floating gate silicon nanocrystal MOS transistor depicted in FIG. 3 for reading the floating trap MOS transistor according to the prior art.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, several embodiments of a multiple memory layer von-volatile memory are described herein. In each of the embodiments, each of the memory layers in the multiple memory layer device may store two bits. In some of the embodiments, charge is stored in each of the memory layers by being trapped in a dielectric layer in a manner similar to a floating trap memory device. In others of the embodiments, the charge is stored in each of the memory layers by being held on semiconductor nanocrystals, preferably silicon, in a manner similar to floating gate silicon nanocrystal memory device.

Figures 1, 2A, 2B:
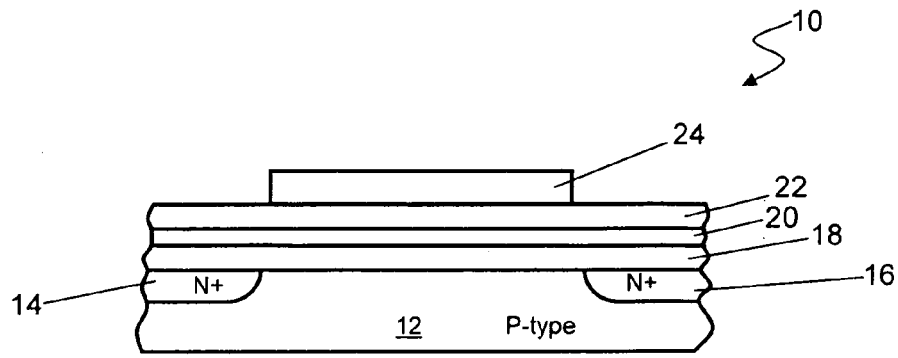
FIG. 1 is a cross-section schematic of a floating trap MOS transistor according to the prior art.
FIG. 2A is a table indicating the voltages applied to the floating trap MOS transistor depicted in FIG. 1 for programming by channel hot electron injection according to the prior art.
FIG. 2B is a table indicating the voltages applied to the floating trap MOS transistor depicted in FIG. 1 for programming by Fowler-Nordheim tunneling according to the prior art.
Figures 3, 4A, 4B:
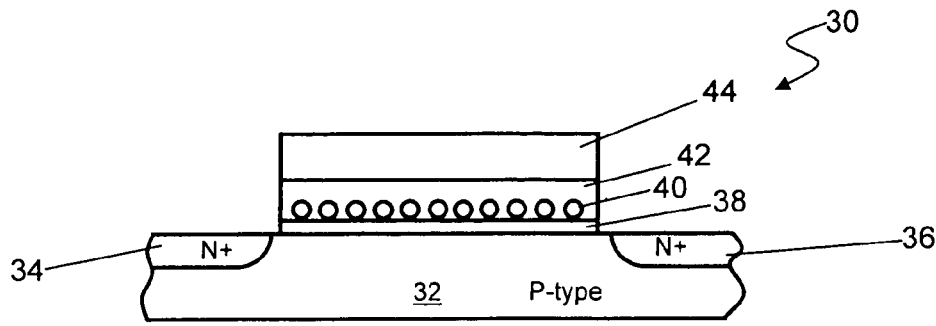
FIG. 3 is a cross-section schematic of a floating gate silicon nanocrystal MOS transistor according to the prior art.
FIG. 4A is a table indicating the voltages applied to the floating gate silicon nanocrystal MOS transistor depicted in FIG. 3 for programming by channel hot electron injection according to the prior art.
FIG. 4B is a table indicating the voltages applied to the floating gate silicon nanocrystal MOS transistor depicted in FIG. 3 for programming by Fowler-Nordheim tunneling according to the prior art.
Figure 5:
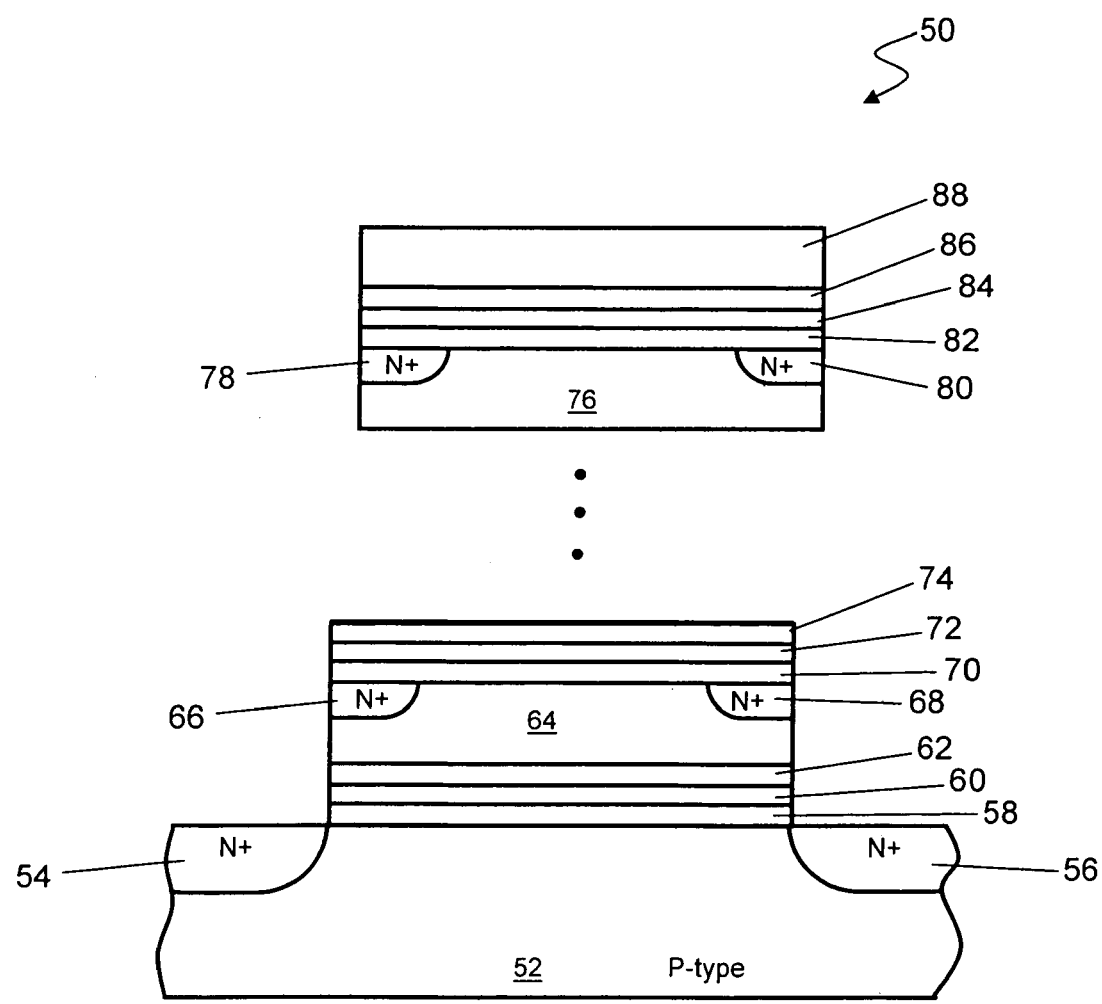
FIG. 5 is a cross-section schematic of a first embodiment of a multiple memory layer floating trap MOS transistor memory device according to the present invention.

In FIG. 5, a first embodiment of a multiple memory layer floating trap memory 50 according to the present invention is illustrated schematically in cross section. It should be appreciated that in each of the memory layers of the multiple memory layer floating trap memory 50 two bits of information may be stored. As a consequence, the multiple memory layer floating trap memory 50, according to the first embodiment of the present invention, is a very high density non-volatile memory device wherein the multiple memory layer floating trap memory 50 of N memory layers can store 2N bits of information. Techniques for programming, erasing and reading the information stored in each of the N memory layers in the multiple memory layer floating trap memory 50 are similar to those disclosed with respect to FIGS. 2A through 2E.

In the lowermost memory layer of the multiple memory layer floating trap memory 50, a p-type region 52 formed by a p-type silicon semiconductor substrate or p-type well formed in a silicon semiconductor substrate has formed in it a first n-type source/drain region 54 and a second n-channel source/drain region 56. The p-type region 52, the first n-type source/drain region 54 and the second n-channel source/drain region 56 form a charge generating layer. It should be appreciated by those of ordinary skill in the art that the p-type region 52, the first n-type source/drain region 54 and the second n-channel source/drain region 56 may alternatively be formed as polysilicon or other semiconductor material on another substrate known to those of ordinary skill in the art.

Preferably, a first insulating layer 58 of silicon dioxide of about 20 to about 60 angstroms in thickness is disposed above the p-type region 52 and at least a portion of the source/drain regions 54 and 56, respectively. Other materials known to those of ordinary skill in the art may be employed as the first insulating layer 58. A charge trapping layer 60 of silicon nitride of about 60 to about 80 angstroms in thickness is disposed above the silicon dioxide first insulating layer 58. Preferably, a second insulating layer 62 of silicon dioxide of about 60 angstroms is formed over the silicon nitride charge trapping layer 60. Other materials known to those of ordinary skill in the art may be employed as the second insulating layer 62. The silicon dioxide first insulating layer 58, silicon nitride charge trapping layer 60, and the silicon dioxide second insulating layer 62 forms a charge retention layer in the multiple memory layer floating trap memory 50.

The silicon nitride charge trapping layer 60 forms the floating trap layer which stores electrons that cross the silicon dioxide first insulating layer 58 into the silicon nitride charge trapping layer 60. The electrons are trapped above the junctions associated with the first and second source/drain regions 54 and 56, respectively. Accordingly, the silicon nitride charge trapping layer 60 is formed so that portions of the silicon nitride charge trapping layer 60 are disposed over the silicon dioxide first insulating layer 58 and above the junctions associated with the first and second source/drain regions 54 and 56, respectively.

The p-type region 52 with the first n-type source/drain region 54 and the second n-channel source/drain region 56, the silicon dioxide first insulating layer 58, silicon nitride charge trapping layer 60, and the silicon dioxide second insulating layer 62 form the first memory layer in the multiple memory layer floating trap memory 50.

According to the present invention, a first doped polysilicon layer 64 is disposed above the silicon dioxide second insulating layer 62. The polysilicon layer 64 is doped p-type with first and second n-type source/drain regions 66 and 68, and is employed both as a gate that controls the placement and removal of charge from the silicon nitride charge trapping layer 60 in the first memory layer of the multiple memory layer floating trap memory 50, and also as the charge generating layer in the second memory layer of the multiple memory layer floating trap memory 50.

Disposed above p-type polysilicon layer 64 and at least a portion of the first and second n-type source/drain regions 66 and 68, respectively, is a first insulating layer 70 of silicon dioxide of about 20 to about 60 angstroms in thickness. Other materials known to those of ordinary skill in the art may be employed as the first insulating layer 70. A charge trapping layer 72 of silicon nitride of about 60 to about 80 angstroms in thickness is disposed above the silicon dioxide first insulating layer 70. A second insulating layer 74 of silicon dioxide of about 60 angstroms is formed over the silicon nitride charge trapping layer 72. Other materials known to those of ordinary skill in the art may be employed as the second insulating layer 74.

The silicon nitride charge trapping layer 72 forms the floating trap layer which stores electrons that cross the silicon dioxide first insulating layer 70 into the silicon nitride charge trapping layer 72. The electrons are trapped above the junctions associated with the first and second source/drain regions 66 and 68, respectively. Accordingly, the silicon nitride charge trapping layer 72 is formed so that portions of the silicon nitride charge trapping layer 72 disposed over the silicon dioxide first insulating layer 70 and above the junctions associated with the first and second source/drain regions 66 and 68, respectively.

Each of the remaining N memory layers in the multiple memory layer floating trap memory 50 is preferably similar to the second memory layer as depicted by the Nth memory layer by a p-type polysilicon layer 76 with the first n-type source/drain region 78 and the second n-channel source/drain region 80, a silicon dioxide first insulating layer 82, a silicon nitride charge trapping layer 84, and a silicon dioxide second insulating layer 86. A polysilicon layer 88 forming a gate for the Nth memory layer is disposed above the silicon dioxide second insulating layer 86. It should be appreciated that polysilicon layer 88 is undoped or is otherwise a metal layer. It should be appreciated that in the multiple memory layer floating trap memory 50 according to the present invention, the memory layers of the multiple memory layer floating trap memory 50 are disposed in a stacked arrangement.

Figure 6A:
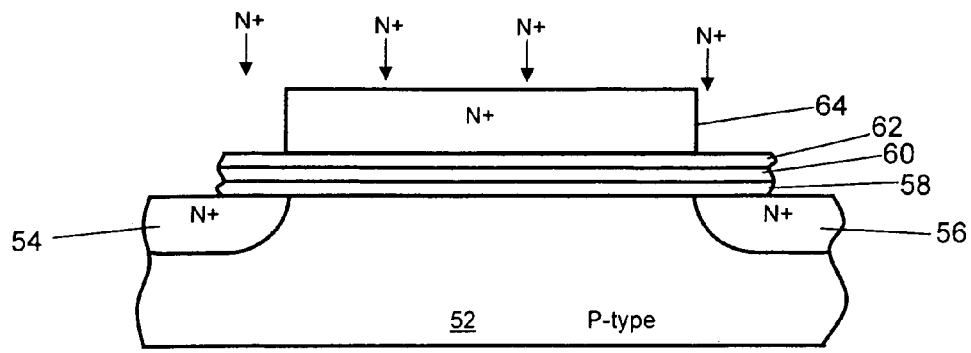
FIGS. 6A–6C are cross-section schematics of selected steps in the fabrication process of the first embodiment of the multiple memory layer floating trap MOS transistor memory device depicted in FIG. 5 according to the present invention.
Figure 6B:
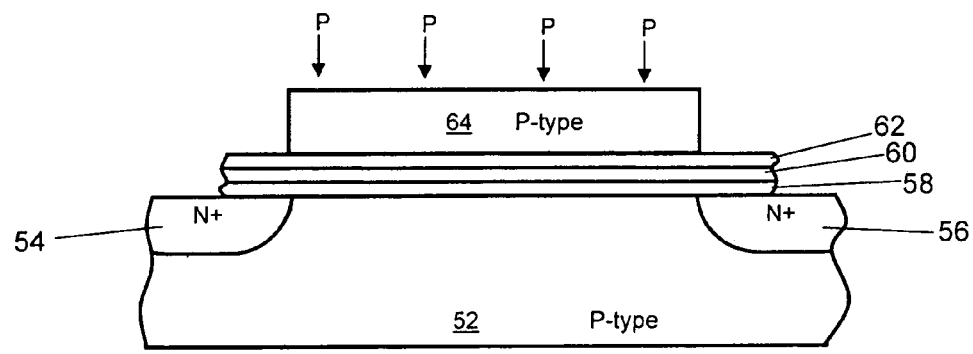
Figure 6C:
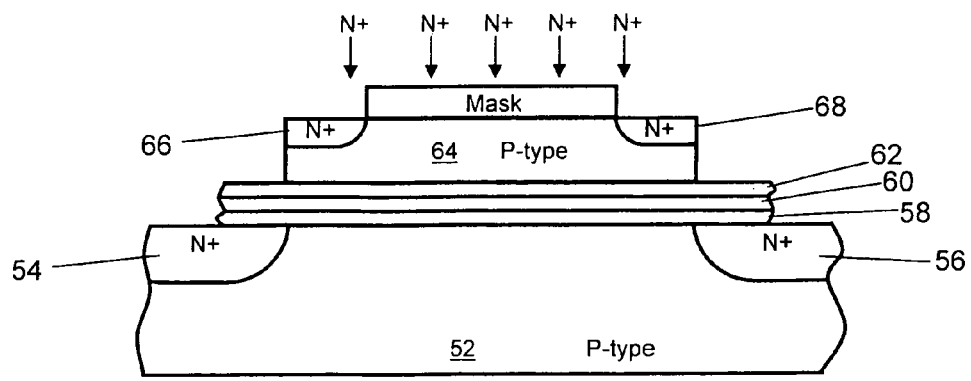

In FIGS. 6A–6C, schematic cross-sections of selected steps in the fabrication of the multiple memory layer floating trap memory 50 depicted in FIG. 5 are illustrated. To prevent confusion, aspects of drawing FIGS. 6A–6C similar to those found in drawing FIG. 5 will employ the same reference numerals as found in drawing FIG. 5. It should be appreciated that the semiconductor processing techniques employed to form the elements depicted in FIGS. 6A–6C are complementary metal-oxide semiconductor (CMOS) techniques well known to those of ordinary skill in the art, and therefore will be described in limited detail to avoid overcomplicating the disclosure herein, and thereby obscuring the present invention.

In FIG. 6A, a p-type region 52 formed by a p-type semiconductor substrate or p-type well formed in a semiconductor substrate is depicted. The p-type well may be formed by well known ion implantation techniques. Next, a silicon dioxide layer first insulating layer 58 of about 20 to about 60 angstroms in thickness is formed on the p-type region 52 along with field oxide regions (not shown) by local oxidation of the silicon or by a chemical vapor deposition (CVD) technique including low pressure CVD (LPCVD), atmospheric pressure CVD (APCVD) and plasma enhanced CVD (PECVD). A silicon nitride charge trapping layer 60 of about 60 to about 80 angstroms in thickness is formed on the silicon dioxide layer 58 by plasma deposited silicon nitride. A silicon dioxide second insulating layer 62 of about 60 angstroms is formed over the nitride layer charge trapping layer 60 by oxidation or by CVD. A layer of polysilicon 64 is then formed on the upper layer of silicon dioxide second insulating layer 62. In FIG. 6A, the polysilicon layer 64 is depicted after being masked and etched by well known semiconductor processing techniques. Next, first and second n-type source/drain regions 54 and 56, respectively, are implanted so that they are self-aligned by the polysilicon layer 64. The n-type implant also dopes the polysilicon layer 64 to n-type.

In FIG. 6B, a p-type implant of the polysilicon layer 64 has been performed to change the upper portion of the polysilicon layer 64 n-type to p-type.

In FIG. 6C, the polysilicon layer 64 is masked, and an n-type implant is performed to form the first and second n-type source/drain regions 66 and 68, respectively. The remaining memory layers in the multiple memory layer floating trap memory 50, depicted by the silicon dioxide first insulating layer 70, the silicon nitride charge trapping layer 72, the silicon dioxide second insulating layer 74 of the second memory layer, and the polysilicon layer 76 having first and n-type second source/drain regions 78 and 80, respectively, the silicon dioxide first insulating layer 82, the silicon nitride charge trapping layer 84, the silicon dioxide second insulating layer 88 of the Nth memory layer are formed in the same manner as the silicon dioxide first insulating layer 58, the silicon nitride charge trapping layer 60, the silicon dioxide second insulating layer 62 of the first memory layer, and the polysilicon layer 64 having first and n-type second source/drain regions 66 and 68, respectively, of the second memory layer in the multiple memory layer floating trap memory 50 just described. Though not depicted, a doped or undoped polysilicon layer 88 or otherwise a metal layer forming a gate for the Nth memory layer is disposed above the silicon dioxide second insulating layer 86 by techniques well known to those of ordinary skill in the art.

Figure 7:
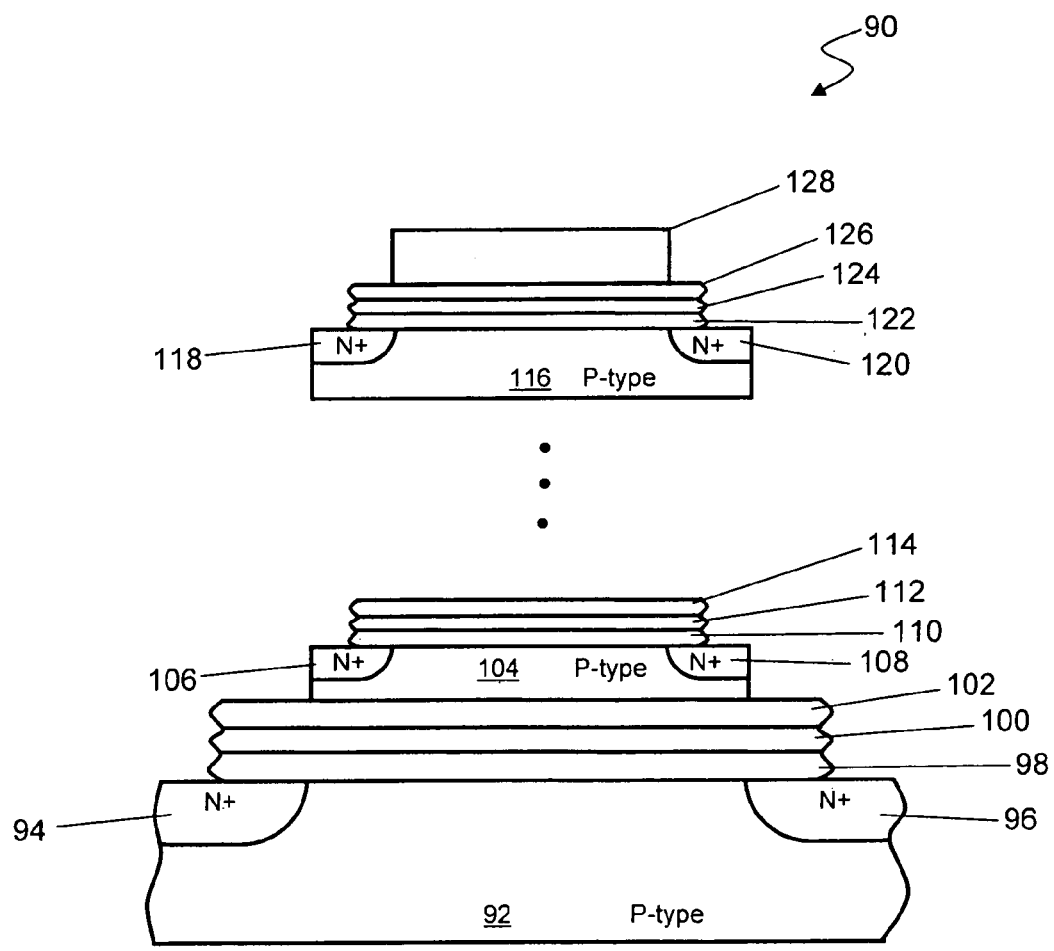
FIG. 7 is a cross-section schematic of a second embodiment of a multiple memory layer floating trap MOS transistor memory device according to the present invention.

In FIG. 7, another embodiment of a multiple memory layer floating trap memory 90 according to the present invention is illustrated schematically in cross section. It should be appreciated that in each of the memory layers of the multiple memory layer floating trap memory 90 two bits of information may be stored. As a consequence, the multiple memory layer floating trap memory 90, according to another embodiment of the present invention, is a very high density non-volatile memory device wherein the multiple memory layer floating trap memory 90 of N memory layers can store 2N bits of information. Techniques for programming, erasing and reading the information stored in each of the N memory layers in the multiple memory layer floating trap memory 90 are similar to those disclosed with respect to FIGS. 2A through 2E.

In the lowermost memory layer of the multiple memory layer floating trap memory 90, a p-type region 92 formed by a p-type silicon semiconductor substrate or p-type well formed in a silicon semiconductor substrate has formed in it a first n-type source/drain region 94 and a second n-channel source/drain region 96. The p-type region 92, the first n-type source/drain region 94 and the second n-channel source/drain region 96 form a charge generating layer. It should be appreciated by those of ordinary skill in the art that the p-type region 92, the first n-type source/drain region 94 and the second n-channel source/drain region 96 may alternatively be formed as polysilicon or other semiconductor material on another substrate known to those of ordinary skill in the art.

Preferably, a first insulating layer 98 of silicon dioxide of about 20 to about 60 angstroms in thickness is disposed above the p-type region 92 and at least a portion of the source/drain regions 94 and 96, respectively. Other materials known to those of ordinary skill in the art may be employed as the first insulating layer 98. A charge trapping layer 100 of silicon nitride of about 60 to about 80 angstroms in thickness is disposed above the silicon dioxide first insulating layer 98. Preferably, a second insulating layer 102 of silicon dioxide of about 60 angstroms is formed over the silicon nitride charge trapping layer 100. Other materials known to those of ordinary skill in the art may be employed as the second insulating layer 102. The silicon dioxide first insulating layer 98, silicon nitride charge trapping layer 100, and the silicon dioxide second insulating layer 102 form a charge retention layer in the multiple memory layer floating trap memory 100.

The silicon nitride charge trapping layer 100 forms the floating trap layer which stores electrons that cross the silicon dioxide first insulating layer 98 into the silicon nitride charge trapping layer 100. The electrons are trapped above the junctions associated with the first and second source/drain regions 94 and 96, respectively. Accordingly, the silicon nitride charge trapping layer 100 is formed so that portions of the silicon nitride charge trapping layer 100 disposed over the silicon dioxide first insulating layer 98 and above the junctions associated with the first and second source/drain regions 94 and 96, respectively.

The p-type region 92 with the first n-type source/drain region 94 and the second n-channel source/drain region 96, the silicon dioxide first insulating layer 98, silicon nitride charge trapping layer 100, and the silicon dioxide second insulating layer 102 form the first memory layer in the multiple memory layer floating trap memory 100.

According to another embodiment of the present invention, a first doped polysilicon layer 104 is disposed above the upper oxide layer 102. The polysilicon layer 104 is doped p-type with first and second n-type source/drain regions 106 and 108, and is employed both as a gate that controls the placement and removal of charge from the silicon nitride charge trapping layer 100 in the first memory layer of the multiple memory layer floating trap memory 90, and also as the charge generating layer in the second memory layer of the multiple memory layer floating trap memory 90. The doped polysilicon layer 104 and the first and second n-type source/drain regions, 94 and 96, respectively, in the p-type well or substrate 92 are formed so that the physical relationship of the vertical edge of the polysilicon layer 104 is aligned with the junctions associated with the first and second n-type source/drain regions 94 and 96, respectively.

Disposed above p-type polysilicon layer 104 and at least a portion of the first and second n-type source/drain regions 106 and 108, respectively, is a first insulating layer 110 of silicon dioxide of about 20 to about 60 angstroms in thickness. Other materials known to those of ordinary skill in the art may be employed as the first insulating layer 110. A charge trapping layer 112 of silicon nitride of about 60 to about 80 angstroms in thickness is disposed above the silicon dioxide first insulating layer 110. A second insulating layer 114 of silicon dioxide of about 60 angstroms is formed over the silicon nitride charge trapping layer 112. Other materials known to those of ordinary skill in the art may be employed as the second insulating layer 112.

The silicon nitride charge trapping layer 112 forms the floating trap layer which stores electrons that cross the silicon dioxide first insulating layer 110 into the silicon nitride charge trapping layer 112. The electrons are trapped above the junctions associated with the first and second source/drain regions 106 and 108, respectively. Accordingly, the silicon nitride charge trapping layer 112 is formed so that portions of the silicon nitride charge trapping layer 112 disposed over the silicon dioxide first insulating layer 110 and above the junctions associated with the first and second source/drain regions 106 and 108, respectively. A polysilicon layer 128 forming a gate for the Nth memory layer is disposed above the silicon dioxide second insulating layer 126. It should be appreciated that polysilicon layer 128 is undoped or is otherwise a metal layer.

Each of the remaining N memory layers in the multiple memory layer floating trap memory 90 is preferably similar to the second memory layer as depicted by the Nth memory layer by a p-type polysilicon layer 116 with the first n-type source/drain region 118 and the second n-channel source/drain region 120, a silicon dioxide first insulating layer 122, a silicon nitride charge trapping layer 124, and a silicon dioxide second insulating layer 126. Though not depicted, it should be appreciated that the vertical edge of the p-type polysilicon layer 116, in a manner similar to each of the p-type polysilicon layers in each of the memory layers is aligned with the source/drain junctions associated with the first and second source/drain regions in the polysilicon layer of the memory layer directly subjacent.

It should be appreciated that in the multiple memory layer floating trap memory 90 according to the present invention, the memory layers of the multiple memory layer floating trap memory 90 are disposed in a stacked arrangement with the p-type polysilicon layers forming tiers. It should also be appreciated that although the memory layers in one embodiment are arranged in a stacked manner and the memory layers in another embodiment are arranged in a stacked arrangement with the p-type polysilicon layers forming tiers, other arrangements of multiple memory layers are contemplated by the disclosure herein.

Figure 8A:
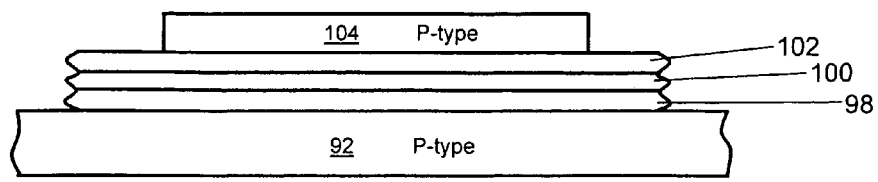
FIGS. 8A–8C are cross-section schematics of selected steps in the fabrication process of an embodiment of the multiple memory layer floating trap MOS transistor memory device depicted in FIG. 7 according to the present invention.
Figure 8B:
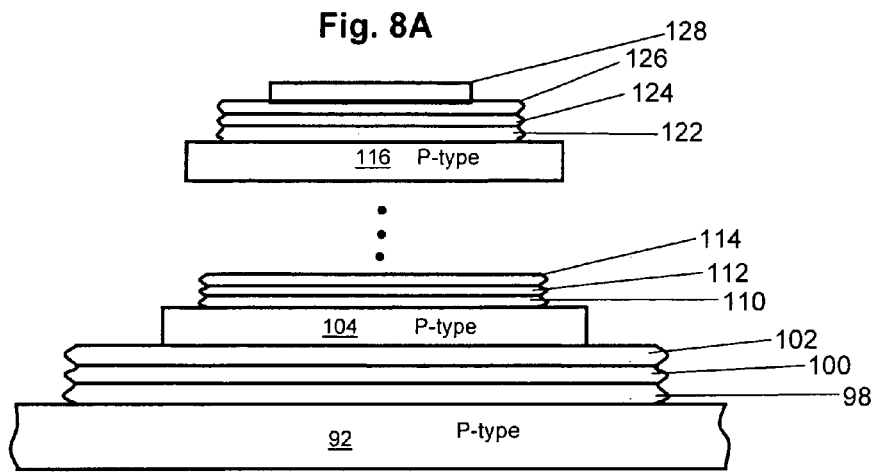
Figure 8C:
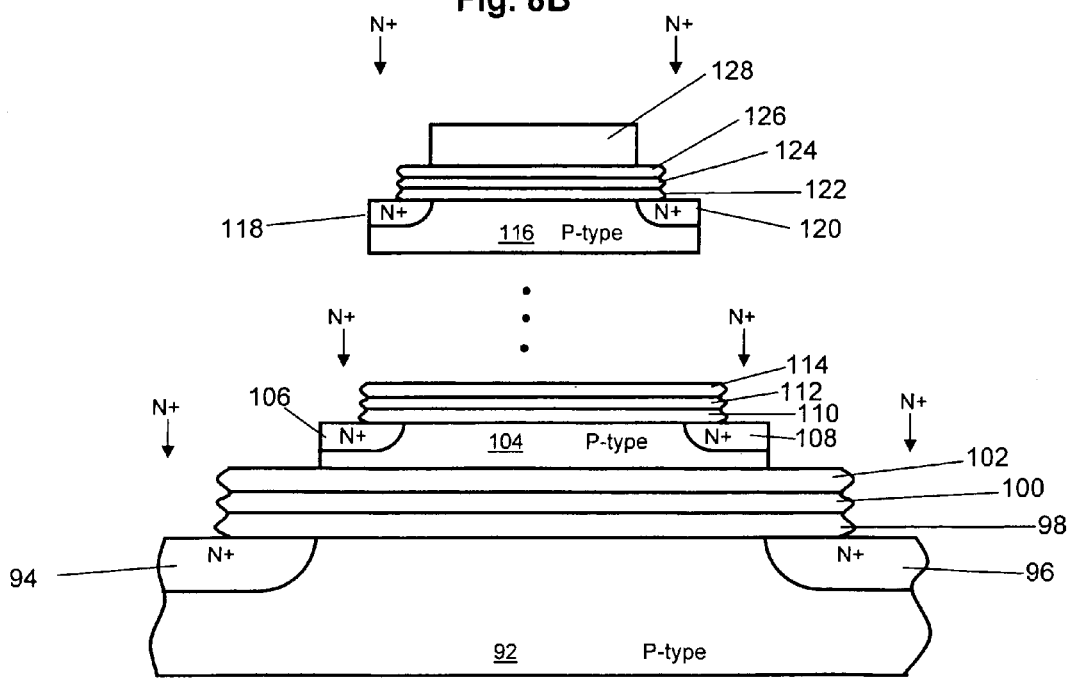

In FIGS. 8A–8C, schematic cross-sections of selected steps in the fabrication of the multiple memory layer floating trap memory 90 depicted in FIG. 7 are illustrated. To prevent confusion, aspects of drawing FIGS. 8A–8C similar to those found in drawing FIG. 7 will employ the same reference numerals as found in drawing FIG. 7. It should be appreciated that the semiconductor processing techniques employed to form the elements depicted in FIGS. 8A–8C are CMOS techniques well known to those of ordinary skill in the art, and therefore will be described in limited detail to avoid overcomplicating the disclosure herein, and thereby obscuring the present invention.

In FIG. 8A, a p-type region 92 formed by a p-type semiconductor substrate or p-type well formed in a semiconductor substrate is depicted. The p-type well may be formed by well known ion implantation techniques. Next, a silicon dioxide first insulating layer 98 of about 20 to about 60 angstroms in thickness is formed on the p-type region 92 along with field oxide regions (not shown) by local oxidation of the silicon or by a chemical vapor deposition (CVD) technique including low pressure CVD (LPCVD), atmospheric pressure CVD (APCVD) and plasma enhanced CVD (PECVD). A silicon nitride charge trapping layer 100 of about 60 to about 80 angstroms in thickness is formed on the silicon dioxide layer 98 by plasma deposited silicon nitride. A silicon dioxide second insulating layer 102 of about 60 angstroms is formed over the nitride layer 100 by oxidation or by CVD. A layer of polysilicon 104 is then formed on the upper layer of silicon dioxide 102. The polysilicon layer 104 is depicted after being masked and etched by well known semiconductor processing techniques, and then implanted with p-type doping by well known ion implantation techniques.

In FIG. 8B, the silicon dioxide first insulating layer 110, the silicon nitride charge trapping layer 112, and the silicon dioxide second insulating layer 114 of the second memory layer in the multiple memory layer floating trap memory 90, the p-type polysilicon layer 116, the silicon dioxide first insulating layer 122, the silicon nitride charge trapping layer 124, and the silicon dioxide second insulating layer 126 of the Nth memory layer in the multiple memory layer floating trap memory 90, and the remaining memory layers are formed in the same manner as the silicon dioxide first insulating layer 98, the silicon nitride charge trapping layer 100, the silicon dioxide second insulating layer 102 of the first memory layer, and the p-type polysilicon layer 104 of the second memory layer in the multiple memory layer floating trap memory 90 just described. A doped or undoped polysilicon layer 128 or otherwise a metal layer forming a gate for the Nth memory layer is disposed above the silicon dioxide second insulating layer 126 by techniques well known to those of ordinary skill in the art.

In FIG. 8C, an n-type ion implantation using well known techniques is performed to form the first and second n-type source/drain regions in each of the memory layers of the multiple memory layer floating trap memory 90, indicated by reference numerals 94 and 96, 106 and 108, and 118 and 120, respectively. It should be appreciated that each of the source/drain regions is self-aligned by the polysilicon layer in the next supra-adjacent memory layer.

Figure 9:
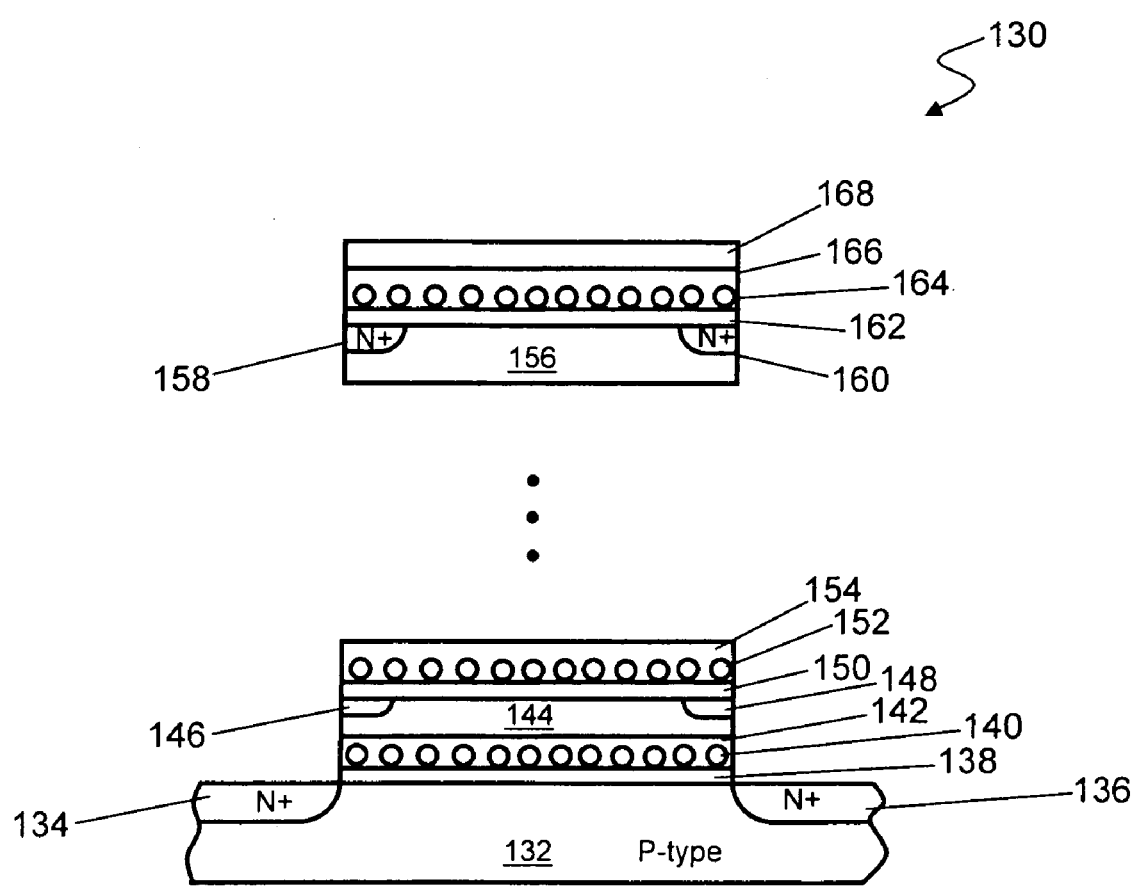
FIG. 9 is a cross-section schematic of a first embodiment of a multiple memory layer floating gate silicon nanocrystal MOS transistor memory device according to the present invention.

In FIG. 9, a first embodiment of a multiple memory layer floating gate silicon nanocrystal memory 130 according to the present invention is illustrated schematically in cross section. It should be appreciated that in each of the memory layers of the multiple memory layer floating gate silicon nanocrystal memory 130 two bits of information may be stored. As a consequence, the multiple memory layer floating gate silicon nanocrystal memory 130, according to the first embodiment of the present invention, is a very high density non-volatile memory device wherein the multiple memory layer floating gate silicon nanocrystal memory 130 of N memory layers can store 2N bits of information. Techniques for programming, erasing and reading the information stored in each of the N memory layers in the multiple memory layer floating gate silicon nanocrystal memory 130 are similar to those disclosed with respect to FIGS. 4A through 4E.

In the lowermost memory layer of the multiple memory layer floating gate silicon nanocrystal memory 130, a p-type region 132 formed by a p-type silicon semiconductor substrate or p-type well formed in a silicon semiconductor substrate has formed in it a first n-type source/drain region 134 and a second n-channel source/drain region 136. The p-type region 132, the first n-type source/drain region 134 and the second n-channel source/drain region 136 form a charge generating layer. It should be appreciated by those of ordinary skill in the art that the p-type region 132, the first n-type source/drain region 134 and the second n-channel source/drain region 136 may alternatively be formed as polysilicon or other semiconductor material on another substrate known to those of ordinary skill in the art.

Preferably, a first insulating layer 138 of silicon dioxide of about 20 to about 60 angstroms in thickness is disposed above the p-type region 132 and at least a portion of the source/drain regions 134 and 136, respectively. Other materials known to those of ordinary skill in the art may be employed as the first insulating layer 138. A charge holding layer 140 of small semiconductor particles, preferably silicon nanocrystals having a size of about 40 to 100 angstroms and spaced apart by about 60 to about 80 angstroms is disposed above the silicon dioxide first insulating layer 138. Preferably, a second insulating layer 142 of silicon dioxide of about 60 angstroms is formed over the silicon nanocrsytal charge holding layer 140. Other materials known to those of ordinary skill in the art may be employed as the second insulating layer 142. The silicon dioxide first insulating layer 138, silicon nanocrsytal charge holding layer 140, and the silicon dioxide second insulating layer 142 form a charge retention layer in the multiple memory layer floating gate silicon nanocrystal memory 130.

The silicon nanocrystal charge holding layer 140 forms the floating gate layer which stores electrons that cross the silicon dioxide first insulating layer 138 into the silicon nanocrystal charge holding layer 140. The electrons are held above the junctions associated with the first and second source/drain regions 134 and 136, respectively. Accordingly, the silicon nanocrystal charge holding layer 140 is formed so that portions of the silicon nanocrystal charge holding layer 140 disposed over the silicon dioxide first insulating layer 138 and above the junctions associated with the first and second source/drain regions 134 and 136, respectively.

The p-type region 132 with the first n-type source/drain region 134 and the second n-channel source/drain region 136, the silicon dioxide first insulating layer 138, silicon nanocrsytal charge holding layer 140, and the silicon dioxide second insulating layer 142 form the first memory layer in the multiple memory layer floating gate silicon nanocrystal memory 130.

According to the present invention, a first doped polysilicon layer 144 is disposed above the silicon dioxide second insulating layer 142. The polysilicon layer 144 is doped p-type with first and second n-type source/drain regions 146 and 148, and is employed both as a gate that controls the placement and removal of charge from the silicon nanocrsytal charge holding layer 140 in the first memory layer of the multiple memory layer floating gate silicon nanocrystal memory 130, and also as the charge generating layer in the second memory layer of the multiple memory layer floating gate silicon nanocrystal memory 130.

Disposed above p-type polysilicon layer 144 and at least a portion of the first and second n-type source/drain regions 146 and 148, respectively, is a first insulating layer 150 of silicon dioxide of about 20 to about 60 angstroms in thickness. Other materials known to those of ordinary skill in the art may be employed as the first insulating layer 150. A charge holding layer 152 of small semiconductor particles, preferably silicon nanocrystals having a size of about 40 to 100 angstroms and spaced apart by about 60 to about 80 angstroms is disposed above the silicon dioxide first insulating layer 150. A second insulating layer 154 of silicon dioxide of about 60 angstroms is formed over the silicon nanocrystal charge holding layer 152. Other materials known to those of ordinary skill in the art may be employed as the second insulating layer 154.

The silicon nanocrystal charge holding layer 152 forms the floating gate layer which stores electrons that cross the silicon dioxide first insulating layer 150 into the silicon nanocrystal charge holding layer 152. The electrons are held above the junctions associated with the first and second source/drain regions 146 and 148, respectively. Accordingly, the silicon nanocrystal charge holding layer 152 is formed so that portions of the silicon nanocrystal charge holding layer 152 disposed over the silicon dioxide first insulating layer 150 and above the junctions associated with the first and second source/drain regions 146 and 148, respectively.

Each of the remaining N memory layers in the multiple memory layer floating gate silicon nanocrystal memory 130 is preferably similar to the second memory layer as depicted by the Nth memory layer by a p-type polysilicon layer 156 with the first n-type source/drain region 158 and the second n-channel source/drain region 160, a silicon dioxide first insulating layer 162, a silicon nanocrystal charge holding layer 164, and a silicon dioxide second insulating layer 166. A polysilicon layer 168 forming a gate for the Nth memory layer is disposed above the silicon dioxide second insulating layer 166. It should be appreciated that polysilicon layer 168 may be undoped or is otherwise a metal layer. It should be appreciated that in the multiple memory layer floating gate silicon nanocrystal memory 130 according to the present invention, the memory layers of the multiple memory layer floating gate silicon nanocrystal memory 130 are disposed in a stacked arrangement.

Figure 10A:
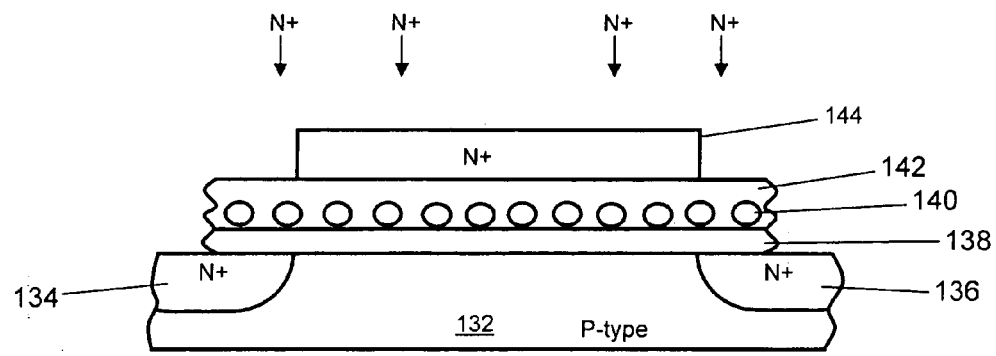
FIGS. 10A–10C are cross-section schematics of selected steps in the fabrication process of the first embodiment of the multiple memory layer floating gate silicon nanocrystal MOS transistor memory device depicted in FIG. 9 according to the present invention.
Figure 10B:
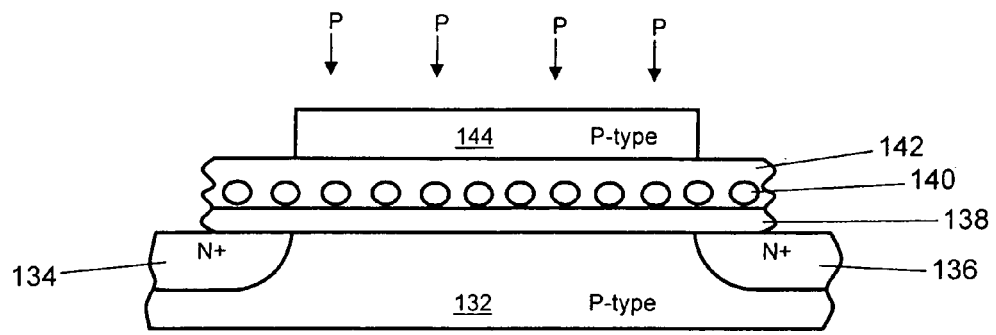
Figure 10C:
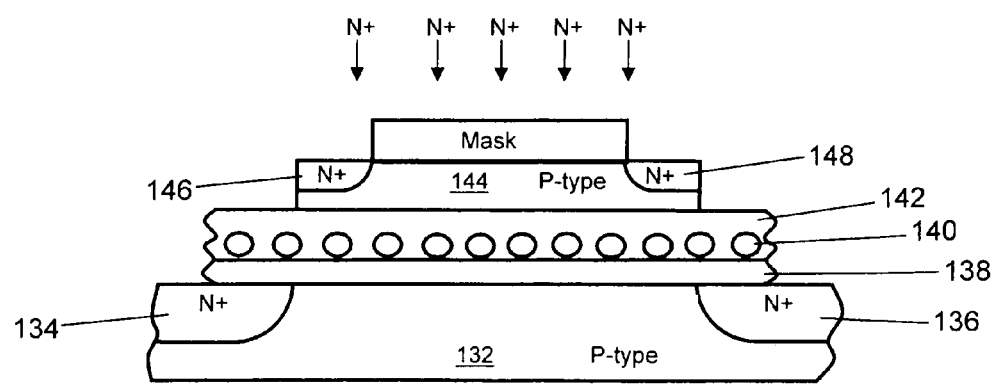

In FIGS. 10A–10C, schematic cross-sections of selected steps in the fabrication of the multiple memory layer floating gate silicon nanocrystal memory 130 depicted in FIG. 9 are illustrated. To prevent confusion, aspects of drawing FIGS. 10A–10C similar to those found in drawing FIG. 9 will employ the same reference numerals as found in drawing FIG. 9. It should be appreciated that the semiconductor processing techniques employed to form the elements depicted in FIGS. 10A–10C are complementary metal-oxide semiconductor (CMOS) techniques well known to those of ordinary skill in the art, and therefore will be described in limited detail to avoid overcomplicating the disclosure herein, and thereby obscuring the present invention.

In FIG. 10A, a p-type region 132 formed by a p-type semiconductor substrate or p-type well formed in a semiconductor substrate is depicted. The p-type well may be formed by well known ion implantation techniques. Next, a silicon dioxide layer first insulating layer 138 of about 20 to about 60 angstroms in thickness is formed on the p-type region 132 along with field oxide regions (not shown) by local oxidation of the silicon or by a chemical vapor deposition (CVD) technique including low pressure CVD (LPCVD), atmospheric pressure CVD (APCVD) and plasma enhanced CVD (PECVD).

Preferably, a silicon nanocrystal charge holding layer 140 is formed on the silicon dioxide layer 138 by first depositing a layer of amorphous silicon on the silicon dioxide layer 138. The amorphous silicon layer may be deposited by CVD, and is preferably is about 5 to 15 angstroms in thickness. The amorphous silicon layer is typically doped by in-situ doping during the deposition of the amorphous silicon layer or by ion implantation following the formation of the amorphous silicon layer with either p-type or n-type dopant atoms so that there is approximately one dopant atom per subsequently formed nanocrystal. Preferably, the amorphous silicon layer is doped with phosphorous at a concentration of about $10^{19}$ cm$^{-3}$ so that there is a dose of approximately $10^{12}$ phosphorous atoms/cm$^2$.

A two-step anneal process is then performed following the deposition of the of the doped amorphous silicon layer. In the first step, a rapid thermal anneal is performed at about 760 to about 900 C for about 5 to about 15 seconds to promote the formation of silicon crystal nuclei in the layer of amorphous silicon. In the second step, a furnace anneal is performed at about 600 to about 800 C for about 1 hour to promote the separation of the amorphous silicon layer and the growth of individual silicon nanocrystals. As a result of the two-step anneal process, doped silicon nanocrystals having a diameter of about 40 to about 60 angstroms are formed having a separation of 40 to 60 angstroms. The density of the silicon nanocrystals is approximately $10^{12}$ phosphorous atoms/cm$^2$, so that there is about 1 dopant atom per nanocrystal.

Other processes are known to those of ordinary skill in the art for the formation of the silicon nanocrystal charge holding layer 140 such as deposition of aerosolized deposition of silicon nanoparticles. It should also be appreciated that other semiconductor materials known to those of ordinary skill in the art may be employed as suitable materials for the formation of the nanocrystals according to the present invention.

A silicon dioxide second insulating layer 142 of about 60 angstroms is formed over the silicon nanocrystal charge holding layer 140 by oxidation or by CVD. A layer of polysilicon 144 is then formed on the upper layer of silicon dioxide second insulating layer 142. In FIG. 10A, the polysilicon layer 144 is depicted after being masked and etched by well known semiconductor processing techniques. Next, first and second n-type source/drain regions 134 and 136, respectively, are implanted so that they are self-aligned by the polysilicon layer 144. The n-type implant also dopes the polysilicon layer 144 to n-type.

In FIG. 10B, a p-type implant of the polysilicon layer 144 has been performed to change the upper portion of the polysilicon layer 144 n-type to p-type.

In FIG. 10C, the polysilicon layer 144 is masked, and an n-type implant is performed to form the first and second n-type source/drain regions 146 and 148, respectively. The remaining memory layers in the multiple memory layer floating gate silicon nanocrystal memory 130, depicted by the silicon dioxide first insulating layer 150, the silicon nitride charge trapping layer 152, the silicon dioxide second insulating layer 154 of the second memory layer, and the polysilicon layer 156 having first and n-type second source/drain regions 158 and 160, respectively, the silicon dioxide first insulating layer 162, the silicon nanocrystal charge holding layer 164, the silicon dioxide second insulating layer 168 of the Nth memory layer are formed in the same manner as the silicon dioxide first insulating layer 138, the silicon nanocrystal charge holding layer 140, the silicon dioxide second insulating layer 142 of the first memory layer, and the polysilicon layer 144 having first and n-type second source/drain regions 146 and 148, respectively, of the second memory layer in the multiple memory layer floating gate silicon nanocrystal memory 130 just described. Though not depicted, a doped or undoped polysilicon layer 168 or otherwise a metal layer forming a gate for the Nth memory layer is disposed above the silicon dioxide second insulating layer 166 by techniques well known to those of ordinary skill in the art.

Figure 11:
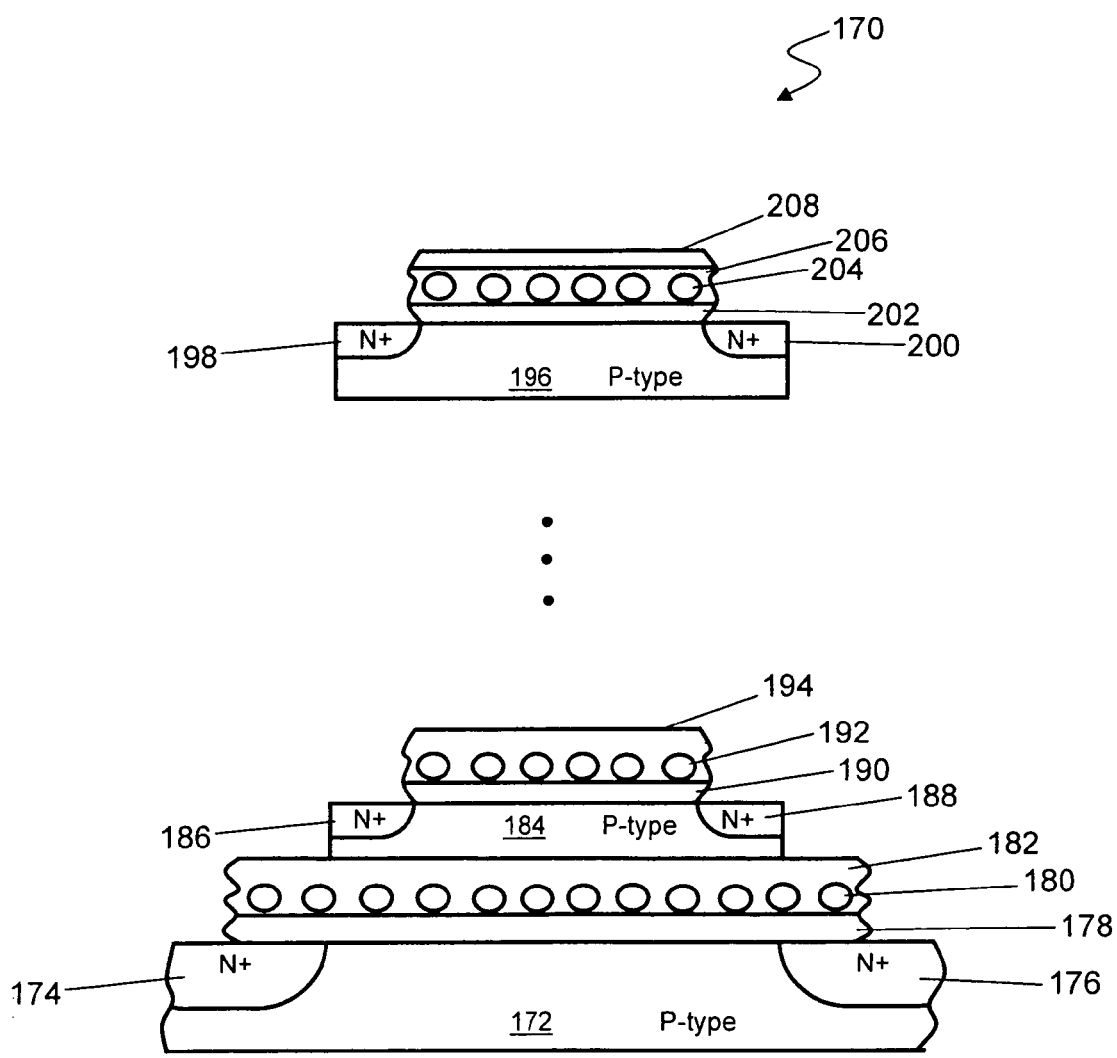
FIG. 11 is a cross-section schematic of a second embodiment of a multiple memory layer floating gate silicon nanocrystal MOS transistor memory device according to the present invention.

In FIG. 11, another embodiment of a multiple memory layer floating gate silicon nanocrystal memory 170 according to the present invention is illustrated schematically in cross section. It should be appreciated that in each of the memory layers of the multiple memory layer floating gate silicon nanocrystal memory 170 two bits of information may be stored. As a consequence, the multiple memory layer of floating gate silicon nanocrystal memory 170, according to another embodiment of the present invention, is a very high density non-volatile memory device wherein the multiple memory layer floating gate silicon nanocrystal memory 170 of N memory layers can store 2N bits of information. Techniques for programming, erasing and reading the information stored in each of the N memory layers in the multiple memory layer floating gate silicon nanocrystal memory 170 are similar to those disclosed with respect to FIGS. 4A through 4E.

In the lowermost memory layer of the multiple memory layer floating gate silicon nanocrystal memory 170, a p-type region 172 formed by a p-type silicon semiconductor substrate or p-type well formed in a silicon semiconductor substrate has formed in it a first n-type source/drain region 174 and a second n-channel source/drain region 176. The p-type region 172, the first n-type source/drain region 174 and the second n-channel source/drain region 176 form a charge generating layer. It should be appreciated by those of ordinary skill in the art that the p-type region 172, the first n-type source/drain region 174 and the second n-channel source/drain region 176 may alternatively be formed as polysilicon or other semiconductor material on another substrate known to those of ordinary skill in the art.

Preferably, a first insulating layer 178 of silicon dioxide of about 20 to about 60 angstroms in thickness is disposed above the p-type region 172 and at least a portion of the source/drain regions 174 and 176, respectively. Other materials known to those of ordinary skill in the art may be employed as the first insulating layer 178.

A charge holding layer 180 of small semiconductor particles, preferably silicon nanocrystals having a size of about 40 to 100 angstroms and spaced apart by about 60 to about 80 angstroms is disposed above the silicon dioxide first insulating layer 178. Preferably, a second insulating layer 182 of silicon dioxide of about 60 angstroms is formed over the silicon nitride charge trapping layer 180. Other materials known to those of ordinary skill in the art may be employed as the second insulating layer 182. The silicon dioxide first insulating layer 178, silicon nanocrystal charge holding layer 180, and the silicon dioxide second insulating layer 182 form as charge retention layer in the multiple memory layer floating trap memory 180.

The silicon nanocrystal charge holding layer 180 forms the floating gate layer which stores electrons that cross the silicon dioxide first insulating layer 178 into the silicon nanocrystal charge holding layer 180. The electrons are held above the junctions associated with the first and second source/drain regions 174 and 176, respectively. Accordingly, the silicon nanocrystal charge holding layer 180 is formed so that portions of the silicon nanocrystal charge holding layer 180 disposed over the silicon dioxide first insulating layer 178 and above the junctions associated with the first and second source/drain regions 174 and 176, respectively.

The p-type region 172 with the first n-type source/drain region 174 and the second n-channel source/drain region 176, the silicon dioxide first insulating layer 178, silicon nanocrystal charge holding layer 180, and the silicon dioxide second insulating layer 182 form the first memory layer in the multiple memory layer floating trap memory 180.

According to another embodiment of the present invention, a first doped polysilicon layer 184 is disposed above the upper oxide layer 182. The polysilicon layer 184 is doped p-type with first and second n-type source/drain regions 186 and 188, and is employed both as a gate that controls the placement and removal of charge from the silicon nanocrystal charge holding layer 180 in the first memory layer of the multiple memory layer floating gate silicon nanocrystal memory 170, and also as the charge generating layer in the second memory layer of the multiple memory layer floating gate silicon nanocrystal memory 170. The doped polysilicon layer 184 and the first and second n-type source/drain regions, 174 and 176, respectively, in the p-type well or substrate 172 are formed so that the physical relationship of the vertical edge of the polysilicon layer 184 is aligned with the junctions associated with the first and second n-type source/drain regions 174 and 176, respectively.

Disposed above p-type polysilicon layer 184 and at least a portion of the first and second n-type source/drain regions 186 and 188, respectively, is a first insulating layer 190 of silicon dioxide of about 20 to about 60 angstroms in thickness. Other materials known to those of ordinary skill in the art may be employed as the first insulating layer 190. A charge holding layer 192 of small semiconductor particles, preferably silicon nanocrystals having a size of about 40 to 100 angstroms and spaced apart by about 60 to about 80 angstroms is disposed above the silicon dioxide first insulating layer 190. A second insulating layer 194 of silicon dioxide of about 60 angstroms is formed over the silicon nanocrystal charge holding layer 192. Other materials known to those of ordinary skill in the art may be employed as the second insulating layer 192.

The silicon nanocrystal charge holding layer 192 forms the floating gate layer which stores electrons that cross the silicon dioxide first insulating layer 190 into the silicon nanocrystal charge holding layer 192. The electrons are held above the junctions associated with the first and second source/drain regions 186 and 188, respectively. Accordingly, the silicon nanocrystal charge holding layer 192 is formed so that portions of the silicon nanocrystal charge holding layer 192 disposed over the silicon dioxide first insulating layer 190 and above the junctions associated with the first and second source/drain regions 186 and 188, respectively. A polysilicon layer 208 forming a gate for the Nth memory layer is disposed above the silicon dioxide second insulating layer 206. It should be appreciated that polysilicon layer 208 is undoped or is otherwise a metal layer.

Each of the remaining N memory layers in the multiple memory layer floating gate silicon nanocrystal memory 170 is preferably similar to the second memory layer as depicted by the Nth memory layer by a p-type polysilicon layer 196 with the first n-type source/drain region 198 and the second n-channel source/drain region 200, a silicon dioxide first insulating layer 202, a silicon nanocrystal charge holding layer 204, and a silicon dioxide second insulating layer 206. Though not depicted, it should be appreciated that the vertical edge of the p-type polysilicon layer 196, in a manner similar to each of the p-type polysilicon layers in each of the memory layers is aligned with the source/drain junctions associated with the first and second source/drain regions in the polysilicon layer of the memory layer directly subjacent.

It should be appreciated that in the multiple memory layer floating gate silicon nanocrystal memory 170 according to the present invention, the memory layers of the multiple memory layer floating gate silicon nanocrystal memory 170 are disposed in a stacked arrangement with the p-type polysilicon layers forming tiers. It should also be appreciated that although the memory layers in one embodiment are arranged in a stacked manner and the memory layers in another embodiment are arranged in a stacked arrangement with the p-type polysilicon layers forming tiers, other arrangements of multiple memory layers are contemplated by the disclosure herein.

Figure 12A:
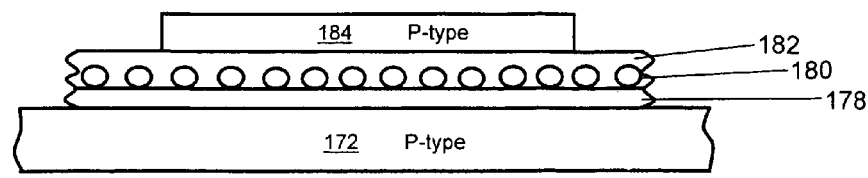
FIGS. 12A–12C are cross-section schematics of selected steps in the fabrication process of an embodiment of the multiple memory layer floating gate silicon nanocrystal MOS transistor memory device depicted in FIG. 11 according to the present invention.
Figure 12B:
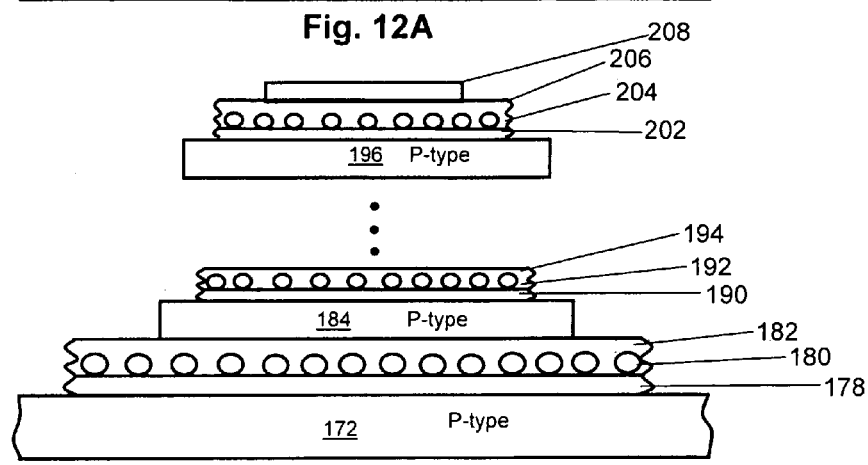
Figure 12C:
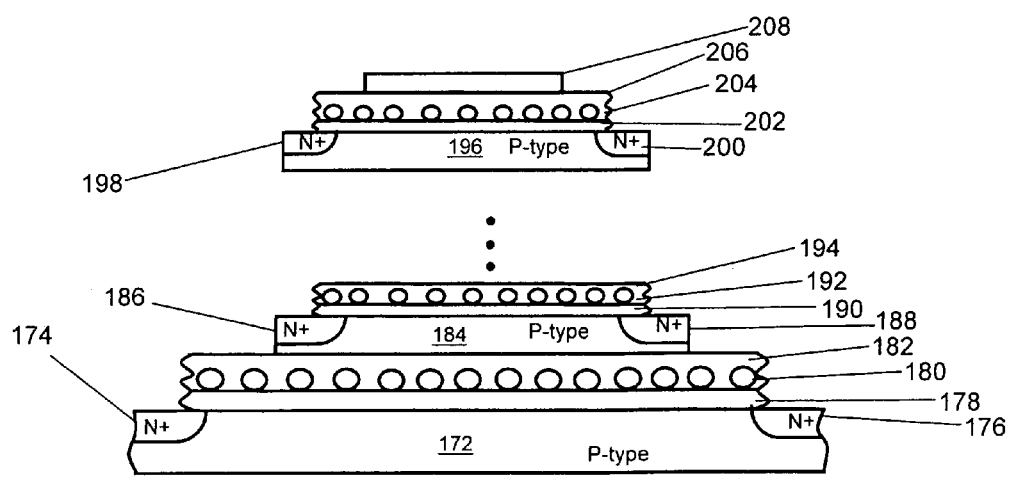

In FIGS. 12A–12C, schematic cross-sections of selected steps in the fabrication of the multiple memory layer floating gate silicon nanocrystal memory 170 depicted in FIG. 11 are illustrated. To prevent confusion, aspects of drawing FIGS. 12A–12C similar to those found in drawing FIG. 11 will employ the same reference numerals as found in drawing FIG. 11. It should be appreciated that the semiconductor processing techniques employed to form the elements depicted in FIGS. 12A–12C are CMOS techniques well known to those of ordinary skill in the art, and therefore will be described in limited detail to avoid overcomplicating the disclosure herein, and thereby obscuring the present invention.

In FIG. 12A, a p-type region 172 formed by a p-type semiconductor substrate or p-type well formed in a semiconductor substrate is depicted. The p-type well may be formed by well known ion implantation techniques. Next, a silicon dioxide first insulating layer 178 of about 20 to about 60 angstroms in thickness is formed on the p-type region 172 along with field oxide regions (not shown) by local oxidation of the silicon or by a chemical vapor deposition (CVD) technique including low pressure CVD (LPCVD), atmospheric pressure CVD (APCVD) and plasma enhanced CVD (PECVD).

Preferably, a silicon nanocrystal charge holding layer 180 is formed on the silicon dioxide layer 178 by first depositing a layer of amorphous silicon on the silicon dioxide layer 178. The amorphous silicon layer may be deposited by CVD, and is preferably is about 5 to 15 angstroms in thickness. The amorphous silicon layer is typically doped by in-situ doping during the deposition of the amorphous silicon layer or by ion implantation following the formation of the amorphous silicon layer with either p-type or n-type dopant atoms so that there is approximately one dopant atom per subsequently formed nanocrystal. Preferably, the amorphous silicon layer is doped with phosphorous at a concentration of about $10^{19}$ cm$^{-3}$ so that there is a dose of approximately $10^{12}$ phosphorous atoms/cm$^2$.

A two-step anneal process is then performed following the deposition of the of the doped amorphous silicon layer. In the first step, a rapid thermal anneal is performed at about 700 to about 900 C for about 5 to about 15 seconds to promote the formation of silicon crystal nuclei in the layer of amorphous silicon. In the second step, a furnace anneal is performed at about 600 to about 800 C for about 1 hour to promote the separation of the amorphous silicon layer and the growth of individual silicon nanocrystals. As a result of the two-step anneal process, doped silicon nanocrystals having a diameter of about 40 to about 60 angstroms are formed having a separation of 40 to 60 angstroms. The density of the silicon nanocrystals is approximately $10^{12}$ phosphorous atoms/cm$^2$, so that there is about 1 dopant atom per nanocrystal.

Other processes are known to those of ordinary skill in the art for the formation of the silicon nanocrystal charge holding layer 180 such as deposition of aerosolized deposition of silicon nanoparticles. It should also be appreciated that other semiconductor materials known to those of ordinary skill in the art may be employed as suitable materials for the formation of the nanocrystals according to the present invention.

A silicon dioxide second insulating layer 182 of about 60 angstroms is formed over the silicon nanocrystal charge holding layer 180 by oxidation or by CVD. A layer of polysilicon 184 is then formed on the upper layer of silicon dioxide 182. The polysilicon layer 184 is depicted after being masked and etched by well known semiconductor processing techniques, and then implanted with p-type doping by well known ion implantation techniques.

In FIG. 12B, the silicon dioxide first insulating layer 190, the silicon nanocrystal charge holding layer 192, and the silicon dioxide second insulating layer 194 of the second memory layer in the multiple memory layer floating trap memory 170, the p-type polysilicon layer 196, the silicon dioxide first insulating layer 202, the silicon nanocrystal charge holding layer 204, and the silicon dioxide second insulating layer 206 of the Nth memory layer in the multiple memory layer floating trap memory 170, and the remaining memory layers are formed in the same manner as the as the silicon dioxide first insulating layer 178, the silicon nanocrystal charge holding layer 180, the silicon dioxide second insulating layer 182 of the first memory layer, and the p-type polysilicon layer 184 of the second memory layer in the multiple memory layer floating trap memory 170 just described. A doped or undoped polysilicon layer 208 or otherwise a metal layer forming a gate for the Nth memory layer is disposed above the silicon dioxide second insulating layer 206 by techniques well known to those of ordinary skill in the art.

In FIG. 12C, an n-type ion implantation using well known techniques is performed to form the first and second n-type source/drain regions in each of the memory layers of the multiple memory layer floating trap memory 170, indicated by reference numerals 174 and 176, 186 and 188, and 198 and 200, respectively. It should appreciated that each the source/drain regions is self-aligned by the polysilicon layer in the next supra-adjacent memory layer.

While the invention has been described with reference to exemplary embodiments, it will be understood by those skilled in the art that various changes may be made and equivalents may be substituted for elements thereof without departing from the scope of the invention. Those of ordinary skill in the art will appreciate that in the above description, the source and drain regions of the MOS and flash EEPROM transistors have been specifically called out to aid in understanding the present invention, and that the source and drain regions may be identified as source/drain regions. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A multiple memory layer device comprising:
    a plurality of stacked memory layers, each of said memory layers in said plurality of stacked memory layers having a charge generating layer, a first insulating layer disposed over said charge generating layer, a charge storing layer disposed over said first insulating layer, and a second insulating layer disposed over said charge storing layer; and
    a gate disposed over said second insluting layer in an uppermost memory layer in said plurality of stacked memory layers,
    wherein each charge generating layer in said plurality of stacked memory layers is a p-type semiconductor material having a plurality of n-type diffusion regions and is in direct contact with the second insulating layer of the memory layer one level below the memory layer of said each charge generating layer.

2. The multiple memory layer device of claim 1, wherein two bits of information may be stored in each charge storing layer in said plurality of stacked memory layers.

3. The multiple memory layer device of claim 1, wherein an outside edge of each charge generating layer other than a lowermost charge generating layer in said plurality of stacked memory layers is aligned with junctions formed by an interface between said p-type semiconductor material and said plurality of n-type diffusion regions in an immediately subjacent charge generating layer.

4. The multiple memory layer device of claim 1, wherein said semiconductor material is polysilicon.

5. The multiple memory layer device of claim 1, wherein the semiconductor material in a lowermost charge generating layer is silicon and the semiconductor material in each of the other charge generating layers is polysilicon.

6. The multiple memory layer device of claim 1, wherein regions above junctions formed by an interface between said p-type semiconductor material and said plurality of n-type diffusion regions are covered by said first insulating layer.

7. The multiple memory layer device of claim 1, wherein said first insulating layer is an oxide of a semiconductor.

8. The multiple memory layer device of claim 1, wherein each first insulating layer is a layer of silicon dioxide having a thickness of at least 20 angstroms.

9. The multiple memory layer device of claim 1, wherein each charge storing layer is a semiconductor nitride.

10. The multiple memory layer device of claim 1, wherein each charge storing layer is a layer of silicon nitride having a thickness of at least 60 angstroms.

11. The multiple memory layer device of claim 1, wherein each second insulating layer is an oxide of a semiconductor.

12. The multiple memory layer device of claim 1, wherein each second insulating layer is a layer of silicon dioxide having a thickness of at least 60 angstroms.

13. The multiple memory layer device of claim 1, wherein the charge-generating layer in one of the stacked memory layers operates as a gate for another of the stacked memory layers.

14. A multiple memory layer device comprising:
    a first memory layer, said first memory layer having a charge generating layer, a first insulating layer disposed over said charge generating layer; a charge storing layer disposed over said first insulating layer, and a second insulating layer disposed over said charge storing layer; and
    a second memory layer disposed over said first memory layer, said second memory layer having a charge generating layer, a first insulating layer disposed over said charge generating layer; a charge storing layer disposed over said first insulating layer, and a second insulating layer disposed over said charge storing layer,
    wherein said charge generating layer of said first memory layer and said charge generating layer of said second memory layer are each a p-type semiconductor material having a plurality of n-type diffusion regions, and
    wherein said charge generating layer of said second memory layer is in direct contact with said second insulating layer of said first memory layer.

15. The multiple memory layer device of claim 14, wherein two bits of information may be stored in each of said first memory layer and said second memory layer.

16. The multiple memory layer device of claim 14 further including a gate disposed over said second memory layer.

17. The multiple memory layer device of claim 14, wherein regions above junctions formed by an interface between said p-type semiconductor material and said plurality of n-type diffusion regions are covered by said first insulating layer.

18. The multiple memory layer device of claim 14, wherein regions above junctions formed by an interface between said p-type semiconductor material of said second memory layer and said plurality of n-type diffusion regions of said second memory layer are covered by said first insulating layer of said second memory layer.

19. The multiple memory layer device of claim 14, wherein said charge storing layer of said second memory layer is a semiconductor nitride.

20. A multiple memory layer device comprising:
    a p-type region in a semiconductor substrate having a first n-type diffusion region, and a second n-type diffusion region;
    a first insulating layer disposed over said p-type region in said semiconductor substrate between said first n-type diffusion region and said second n-type diffusion region and junctions formed by an interface between said p-type region in said semiconductor substrate and said first n-type diffusion region and said second r-type diffusion region;

a first charge storing layer disposed over said a first insulating layer, including portions of said first insulating layer disposed over said p-type region in said semiconductor substrate between said first n-type diffusion region and said second n-type diffusion region and junctions formed by an interface between said p-type region in said semiconductor substrate and said first n-type diffusion region and said second n-type diffusion region;

a second insulating layer disposed over said a first charge storing layer, including portions of said first charge storing layer disposed over said first insulating layer;

a polysilicon layer disposed over said second insulating layer, said polysilicon layer having a p-type region, a first n-type diffusion region in said p-type region in said polysilicon layer, and a second n-type diffusion region in said p-type region in said polysilicon layer, wherein said polysilicon layer is in direct contact with said second insulating layer;

a third insulating layer disposed over said p-type region in said polysilicon layer between said first n-type diffusion region in said polysilicon layer and said second n-type diffusion region in said polysilicon layer and junctions formed by an interface between said p-type region in said polysilicon layer and said first n-type diffusion region in said polysilicon layer and said second n-type diffusion region in said polysilicon layer;

a second charge storing layer disposed over said a third insulating layer, including portions of said third insulating layer disposed over said p-type region in said polysilicon layer between said first n-type diffusion region in said polysilicon layer and said second n-type diffusion region in said polysilicon layer and junctions formed by an interface between said p-type region in said polysilicon layer and said first n-type diffusion region in said polysilicon layer and said second n-type diffusion region in said polysilicon layer; and a fourth insulating layer disposed over said a second charge storing layer, including portions of said first charge storing layer disposed over said first insulating layer.

* * * * *